(12) United States Patent (10) Patent No.: US 8,421,054 B2
Iwanaga et al. (45) Date of Patent: Apr. 16, 2013

(54) LIGHT-EMITTING DIODE

(75) Inventors: Junko Iwanaga, Osaka (JP); Toshiya Yokogawa, Nara (JP); Atsushi Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/351,452

(22) Filed: Jan. 17, 2012

(65) Prior Publication Data

US 2012/0113656 A1 May 10, 2012

Related U.S. Application Data

(63) Continuation of application No. PCT/JP2010/004509, filed on Jul. 12, 2010.

(30) Foreign Application Priority Data

Jul. 22, 2009 (JP) .................................. 2009-171499

(51) Int. Cl.
*H01L 29/04* (2006.01)
*H01L 29/26* (2006.01)

(52) U.S. Cl.
USPC ........................................................... 257/11

(58) Field of Classification Search .................. 362/382; 257/11, 13, 43, 79, 100, 103, 615
See application file for complete search history.

(56) References Cited

U.S. PATENT DOCUMENTS

| 2005/0012109 A1* | 1/2005 | Kohno et al. .................. 257/103 |
| 2006/0226412 A1 | 10/2006 | Saxler et al. |
| 2007/0102693 A1 | 5/2007 | Nagai |
| 2008/0029761 A1 | 2/2008 | Peng |
| 2009/0065800 A1 | 3/2009 | Wirth et al. |
| 2009/0065900 A1 | 3/2009 | Saito et al. |
| 2009/0127568 A1* | 5/2009 | Kinoshita et al. ................ 257/79 |
| 2010/0219419 A1 | 9/2010 | Hata et al. |

FOREIGN PATENT DOCUMENTS

| JP | 2001-308462 A | 11/2001 |
| JP | 2001-358371 A | 12/2001 |
| JP | 2002-164617 A | 6/2002 |
| JP | 2003-229639 A | 8/2003 |

(Continued)

OTHER PUBLICATIONS

International Search Report for corresponding International Application No. PCT/JP2010/004509 mailed Aug. 3, 2010.

(Continued)

*Primary Examiner* — Ali Alavi
(74) *Attorney, Agent, or Firm* — Renner, Otto, Boisselle & Sklar, LLP

(57) ABSTRACT

A light-emitting diode element includes: an n-type conductive layer 2 being made of a gallium nitride-based compound, a principal surface being an m-plane; a semiconductor multilayer structure 21 provided on a first region 2a of the principal surface of the n-type conductive layer 2, the semiconductor multilayer structure 21 including a p-type conductive layer 4 and an active layer 3; a p-electrode 5 provided on the p-type conductive layer 4; a conductor portion 9 provided on a second region 2b of the principal surface of the n-type conductive layer 2, the conductor portion 9 being in contact with an inner wall of a through hole 8; and an n-type front surface electrode 6 provided on the second region 2b of the principal surface of the n-type conductive layer 2, the n-type front surface electrode 6 being in contact with the conductor portion 9.

11 Claims, 20 Drawing Sheets

FOREIGN PATENT DOCUMENTS

| | | |
|---|---|---|
| JP | 2003-332697 A | 11/2003 |
| JP | 2008-078440 A | 4/2008 |
| JP | 2008-235792 A | 10/2008 |
| JP | 2009-032900 A | 2/2009 |
| JP | 2009-043832 A | 2/2009 |
| JP | 2010-062245 A | 3/2010 |
| WO | 03/044872 A1 | 5/2003 |
| WO | 2008/004437 A1 | 1/2008 |
| WO | 2011/010436 A1 | 1/2011 |
| WO | 2011/125311 A1 | 10/2011 |

OTHER PUBLICATIONS

Form PCT/ISA/237 and Partial English Translation for corresponding International Application No. PCT/JP2010/004509 dated Aug. 3, 2010.

Form PCT/ISA/220, PCT/ISA/210 and PCT/ISA/237 for related International Application No. PCT/JP2011/001895 mailed May 10, 2011.

Co-pending U.S. Appl. No. 13/613,464, filed Sep. 13, 2012.

* cited by examiner

○ N
● Ga

LIGHT-EMITTING DIODE

This is a continuation of International Application No. PCT/JP2010/004509, with an international filing date of Jul. 12, 2010, which claims priority of Japanese Patent Application No. 2009-171499, filed on Jul. 22, 2009, the contents of which are hereby incorporated by reference.

TECHNICAL FIELD

The present disclosure relates to a light-emitting diode and particularly to a non-polar plane light-emitting diode.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors") have been researched and developed particularly extensively. As a result, blue light-emitting diodes (LEDs), green LEDs, and semiconductor laser diodes made of GaN-based semiconductors have already been used in actual products (See, for example, Patent Documents 1 and 2).

A gallium nitride-based semiconductor has a wurtzite crystal structure. FIG. 1 schematically illustrates a unit cell of GaN. In an $Al_aGa_bIn_cN$ (where $0 \leq a, b, c \leq 1$ and $a+b+c=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane", respectively.

The wurtzite crystal structure has other typical crystallographic plane orientations than the c-plane, as shown in FIG. 3. FIG. 3(a) shows a (0001) plane. FIG. 3(b) shows a (10-10) plane. FIG. 3(c) shows a (11-20) plane. FIG. 3(d) shows a (10-12) plane. As used herein, "-" attached on the left-hand side of a Miller-Bravais index in the parentheses means a "bar" (a negative direction index). The (0001) plane, the (10-10) plane, the (11-20) plane, and the (10-12) plane are the c-plane, the m-plane, the a-plane, and the r-plane, respectively. The m-plane and the a-plane are "non-polar planes" that are parallel to the c-axis (primitive vector c), and the r-plane is a "semi-polar plane".

For years, a light-emitting device in which a gallium nitride-based compound semiconductor is used is fabricated by means of "c-plane growth". As used herein, the "X-plane growth" means epitaxial growth that is produced perpendicularly to the X plane (where X=c, m, a, or r) of a hexagonal wurtzite structure. As for the X-plane growth, the plane will be sometimes referred to herein as a "growing plane". Furthermore, a layer of semiconductor crystals that have been formed as a result of the X-plane growth will be sometimes referred to herein as an "X-plane semiconductor layer".

When a light-emitting device is fabricated using a semiconductor multilayer structure formed by means of the c-plane growth, strong internal polarization occurs in a direction perpendicular to the c-plane (c-axis direction) because the c-plane is a polar plane. The reason for occurrence of the polarization is that, on the c-plane, there is a shift in the c-axis direction between the positions of a Ga atom and a N atom. If such polarization occurs in a light emitting section, a quantum confinement Stark effect of carriers occurs. This effect reduces the probability of radiative recombination of carriers in the light-emitting section and accordingly reduces the light emission efficiency.

In view of such circumstances, in recent years, intensive research has been carried out on growth of a gallium nitride-based compound semiconductor on a non-polar plane, such as m-plane and a-plane, and a semi-polar plane, such as r-plane. If a non-polar plane is available as the growing plane, no polarization occurs in the layer thickness direction (crystal growth direction) of the light-emitting section. Therefore, the quantum confinement Stark effect does not occur. Thus, a light-emitting device which potentially has high efficiency can be fabricated. Even when the growing plane is a semi-polar plane, the influence of the quantum confinement Stark effect can be greatly reduced.

Light-emitting diode products commercially available in the present market are manufactured by mounting to a submount a light-emitting diode element (LED chip) which is fabricated by epitaxially growing a GaN-based semiconductor layer, such as GaN, InGaN, AlGaN, or the like, on a c-plane substrate. The planar size of a light-emitting diode element (the planar size of the principal surface of the substrate: hereinafter, simply referred to as "chip size") varies depending on the use of the light-emitting diode element. Typical chip size is, for example, 300 μm×300 μm or 1 mm×1 mm.

The arrangement of the electrodes of the light-emitting diode element can be generally classified into two types. One is the "opposite-surface electrode type" wherein the p-electrode and the n-electrode are provided on the front surface and the rear surface, respectively, of the light-emitting diode element. The other one is the "front-surface electrode type" wherein both the p-electrode and the n-electrode are provided on the front surface of the light-emitting diode element. Hereinafter, the configurations of prior art light-emitting diode elements which have such electrode arrangements will be described.

FIG. 4(a) is a cross-sectional view showing a light-emitting diode element of the opposite-surface electrode type. FIG. 4(b) is a perspective view of the light-emitting diode element of the opposite-surface electrode type. FIG. 4(c) is a cross-sectional view showing the light-emitting diode element of the opposite-surface electrode type which is mounted on a mounting base 12. FIG. 5(a) is a cross-sectional view showing the light-emitting diode element of the front-surface electrode type which is mounted on the mounting base 12. FIG. 5(b) is a side view of the light-emitting diode element of the front-surface electrode type, which is seen from the side including a p-electrode 5 and an n-type front surface electrode 6.

In the example shown in FIG. 4(a) and FIG. 4(b), a multilayer structure is provided on an n-type substrate 1 which is made of GaN. The multilayer structure includes an n-type conductive layer 2 which is made of GaN, an active layer 3 which is made of a quantum well of InGaN and GaN, and a p-type conductive layer 4 which is made of GaN. The p-electrode 5 is provided on the p-type conductive layer 4, and an n-type rear surface electrode 7 is provided on the rear surface of the n-type substrate 1. In this example, light emitted by the active layer 3 is extracted through the rear surface of the n-type substrate 1. As such, the n-type rear surface electrode 7 is made of a transparent electrode material. When the n-type rear surface electrode 7 is made of a nontransparent conductive material, the n-type rear surface electrode 7 is provided in part of the rear surface of the n-type substrate 1 so as not to block the light. When mounting a light-emitting diode element of the opposite-surface electrode type wherein the n-type rear surface electrode 7 is transparent, the p-electrode 5 is arranged so as to be located on the mounting base 12 side as shown in FIG. 4(c). On the n-type rear surface electrode 7, a bonding pad 15 is provided. The bonding pad 15 is electrically coupled to the mounting base 12 via a wire 16.

In the example shown in FIG. 5(a) and FIG. 5(b), the p-type conductive layer 4, the active layer 3, and the n-type conductive layer 2 are partially removed, and the n-type front surface electrode 6 is provided on the exposed part of the n-type conductive layer 2. The p-electrode 5 is provided on the p-type conductive layer 4. In this example, light generated in the active layer 3 is extracted through the rear surface of the substrate 1. Therefore, when mounting a light-emitting diode element of this type, the diode element is mounted such that the p-electrode 5 and the n-type front surface electrode 6 are located on the mounting base 12 side.

In the case of the opposite-surface electrode type, the electric resistance between the p-electrode 5 and the n-type rear surface electrode 7 is greatly affected by the resistance component of the GaN substrate 1. Therefore, it is preferred to reduce the resistance of the GaN substrate 1 as small as possible. The GaN semiconductor is doped with an n-type impurity at a relatively high concentration than a p-type impurity. Therefore, in general, a low resistance is realized more readily with the n-type impurity. Thus, commonly, the conductivity type of the GaN substrate 1 is set to the n-type.

Also, in the case of the front-surface electrode type, the electric resistance between the p-electrode 5 and the n-type front surface electrode 6 is affected by the resistance component of the GaN substrate 1. Therefore, commonly, the conductivity type of the GaN substrate 1 is set to the n-type.

The above-described electrode arrangements have been employed in c-plane light-emitting diode elements, and they are also applicable to m-plane light-emitting diode elements without modification.

CITATION LIST

Patent Literature

Patent Document 1: Japanese Laid-Open Patent Publication No. 2001-308462
Patent Document 2: Japanese Laid-Open Patent Publication No. 2003-332697

SUMMARY OF INVENTION

Technical Problem

However, in the prior art configurations which have previously been described, as the input power increases, the contact resistance and the resistance of the conductive layer also increase. Therefore, the voltage applied to the active layer decreases, so that the power efficiency deteriorates. Also, there is a problem that a dark current generated due to carriers overflowing from the active layer, or an increase in chip temperature which is attributed to the resistances of the conductive layer and the contact portion, leads to a decrease of the internal quantum efficiency.

Particularly in the case of using an m-plane GaN layer, the impurity concentration of the n-type conductive layer is low, so that the resistance in the n-type conductive layer increases, as compared with a case where a c-plane GaN layer is used. Furthermore, the m-plane GaN layer has a tendency that the contact resistance of the n-electrode is higher due to its crystal structure than the c-plane GaN. As a result of the increase of these resistances, the power efficiency deteriorates, and the probability of heat emission increases.

One of the objects of the present disclosure is to decrease the contact resistance and prevent the increase of the chip temperature, thereby providing a light-emitting diode element with high power efficiency and high internal quantum efficiency.

Solution to Problem

A light-emitting diode element according to an embodiment of the present invention includes: a first semiconductor layer of a first conductivity type having a principal surface and a rear surface, the first semiconductor layer being made of a gallium nitride-based compound, the principal surface being an m-plane; a semiconductor multilayer structure provided on a first region of the principal surface of the first semiconductor layer, the semiconductor multilayer structure including a second semiconductor layer of a second conductivity type and an active layer interposed between the first semiconductor layer and the second semiconductor layer; a first electrode provided on the second semiconductor layer; a conductor portion provided on a second region of the principal surface of the first semiconductor layer, the conductor portion being in contact with an inner wall of a through hole penetrating through the first semiconductor layer; and a second electrode provided on the second region of the principal surface of the first semiconductor layer, the second electrode being in contact with the conductor portion.

In one embodiment, a lateral surface of the inner wall of the through hole includes a c-plane or an a-plane.

In one embodiment, the light-emitting diode element further includes a third electrode provided on the rear surface of the first semiconductor layer, wherein the conductor portion and the third electrode are in contact with each other.

In one embodiment, the first semiconductor layer includes a semiconductor substrate of the first conductivity type.

In one embodiment, part of a lateral surface of the inner wall of the through hole is a +c-plane, and another part of the lateral surface of the inner wall of the through hole is a −c-plane; and the +c-plane at the lateral surface of the inner wall is provided at a position which is closer to the active layer than the −c-plane at the lateral surface of the inner wall.

In one embodiment, the through hole is provided in a central portion of the principal surface of the first semiconductor layer.

In one embodiment, a lateral surface of the inner wall of the through hole includes two opposite a-planes and a +c-plane and a −c-plane which are opposite to each other; and when viewed in a direction perpendicular to the principal surface of the first semiconductor layer, the active layer has a side corresponding to a side defined by one of the two a-planes, a side corresponding to a side defined by the other one of the two a-planes, and a side corresponding to a side defined by the +c-plane, but does not have a side corresponding to a side defined by the −c-plane.

In one embodiment, when viewed in a direction perpendicular to the principal surface of the first semiconductor layer, the through hole has a square or rectangular shape, and the active layer has a square-shaped or rectangular-shaped recess.

In one embodiment, the second electrode, the third electrode, and the conductor portion are integrally made of a same metal material.

In one embodiment, when viewed in a direction perpendicular to the principal surface of the first semiconductor layer, the third electrode is provided in a region extending over the first electrode.

In one embodiment, when viewed in a direction perpendicular to the principal surface of the first semiconductor layer, portions of the third electrode are provided in regions extending over the first electrode with a space therebetween.

A light-emitting diode device according to an embodiment of the present invention includes: the light-emitting diode element of the present invention; and a mounting base, wherein the light-emitting diode element is provided on the mounting base such that a side of the light-emitting diode element on which the first electrode and the second electrode are provided is opposite to the mounting base.

Advantageous Effects of Invention

According to the present disclosure, a through hole is provided in the first semiconductor layer whose principal surface is an m-plane, whereby a plane whose contact resistance relative to a conductor portion is lower than that of the m-plane, for example, +c-plane or a-plane, can appear on the inner wall of the through hole. By bringing the conductor portion which is part of an electrode into contact with the inner wall of the through hole, the total contact resistance between the first semiconductor layer of the first conductivity type and the electrodes can be decreased. As a result, the voltage applied to the active layer can be maintained to a sufficient magnitude, and the power efficiency can be improved. Also, the probability of heat emission which is attributed to the contact resistance decreases.

Furthermore, release of heat from the chip is enhanced by the conductor portion. This prevents an increase in temperature of the active layer, so that the light emission efficiency and the internal quantum efficiency can be improved.

Also, a conductor portion is provided in the through hole so that the contact area of the first semiconductor layer and the electrode increases. Therefore, the total contact resistance between the first semiconductor layer of the first conductivity type and the electrodes can be decreased, and a decrease in bias at the contact portion can be prevented. Thus, a decrease in power efficiency can be prevented. Also, an electric current can be allowed to uniformly flow via the through hole in a good heat releasability condition. As a result, the efficiency of the light-emitting diode element is improved, and concentration of the electric current at an electrode edge is prevented, so that the reliability can be improved.

DESCRIPTION OF EMBODIMENTS

Figure 1:
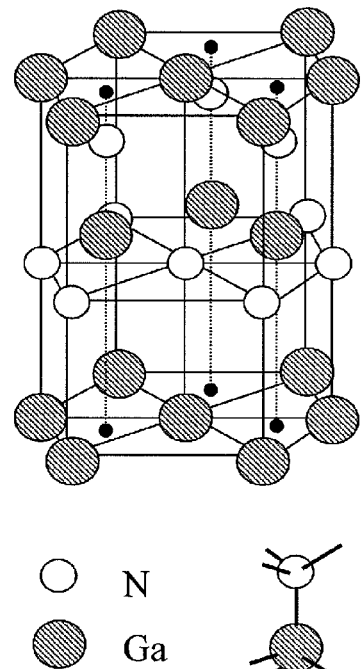
FIG. 1 is a diagram schematically illustrating a unit cell of GaN.
Figure 2:
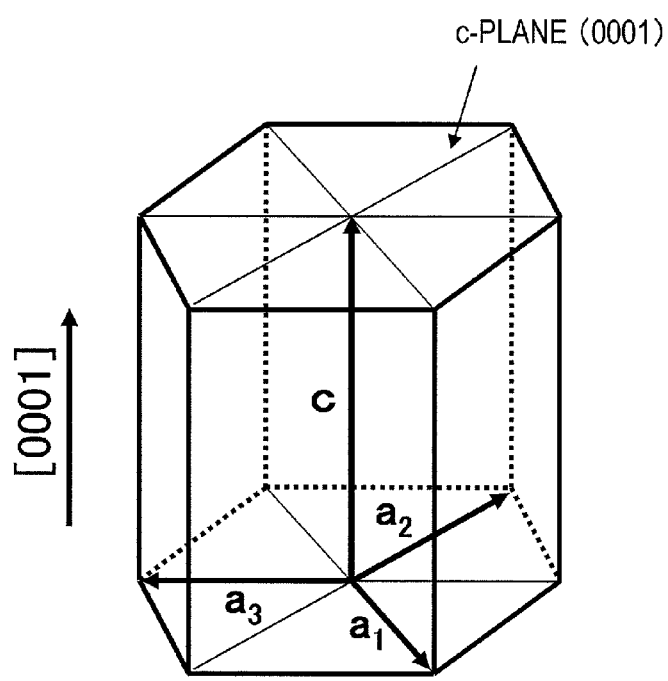
FIG. 2 is a diagram showing four primitive vectors $a_1, a_2, a_3$ and c, which are generally used to represent planes of a wurtzite crystal structure with four indices (i.e., hexagonal indices).
Figure 3:
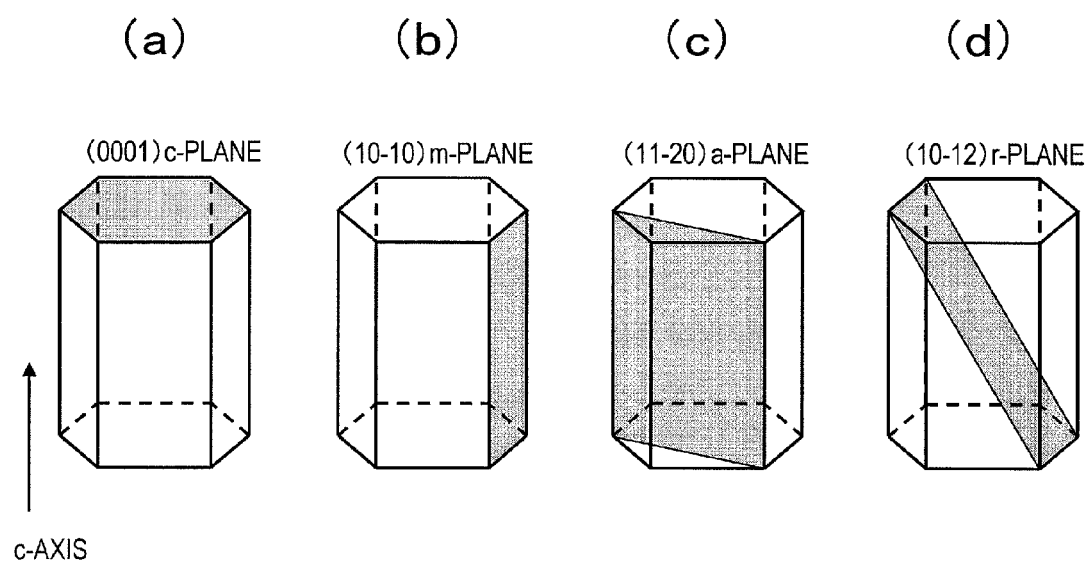
FIG. 3(a) shows the (0001) plane.
FIG. 3(b) shows the (10-10) plane.
FIG. 3(c) shows the (11-20) plane.
FIG. 3(d) shows the (10-12) plane.
Figure 4:
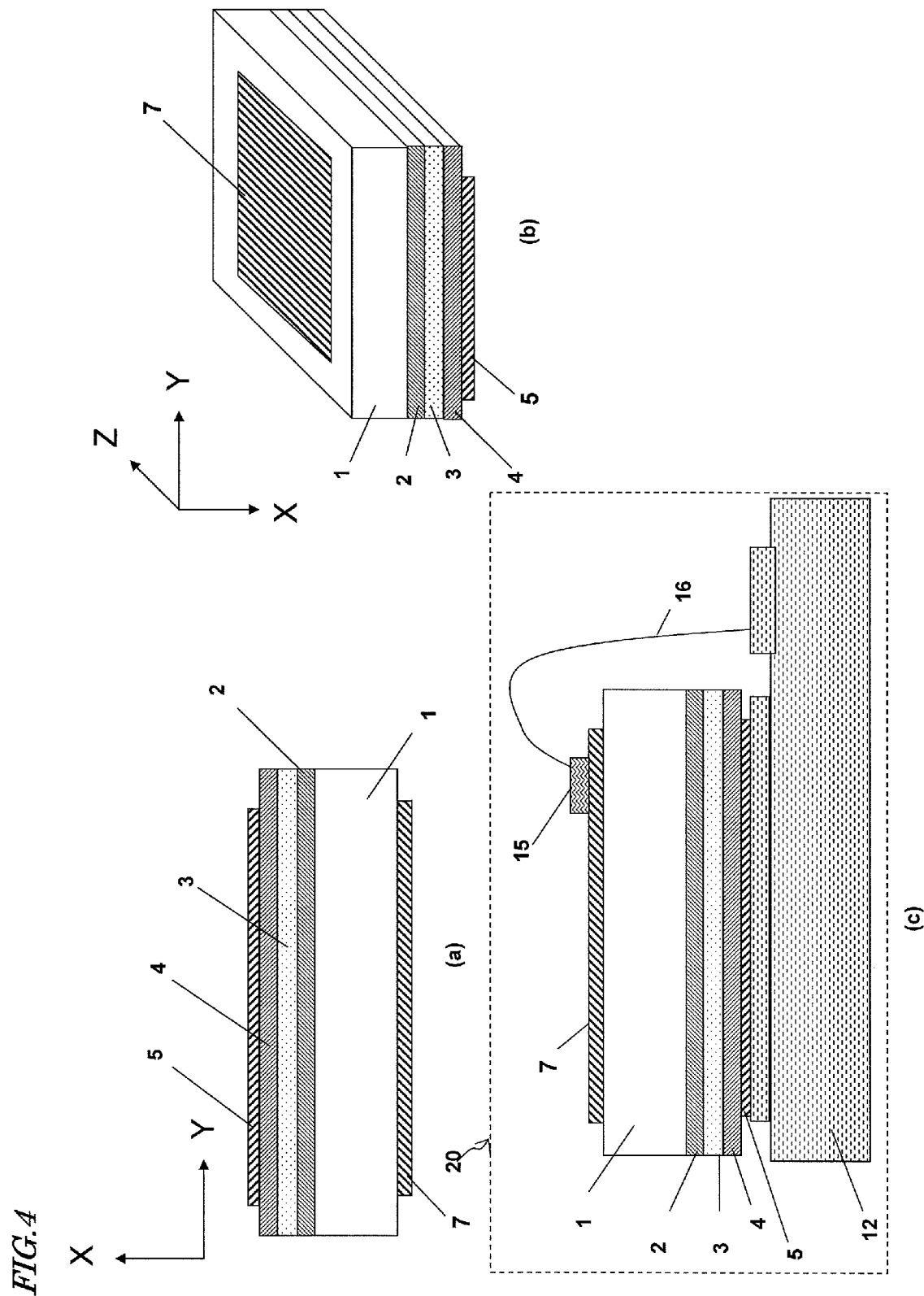
FIG. 4(a) is a cross-sectional view showing a light-emitting diode element of the opposite-surface electrode type.
FIG. 4(b) is a perspective view of the light-emitting diode element of the opposite-surface electrode type.
FIG. 4(c) is a cross-sectional view showing the light-emitting diode element of the opposite-surface electrode type which is mounted on the mounting base 12.

Hereinafter, embodiments of the present disclosure will be described with reference to the drawings.

Embodiment 1

FIG. 6(a) is a cross-sectional view showing Embodiment 1 of the light-emitting diode device according to the present invention. FIG. 6(b) is a diagram showing a rear surface 1b of an n-type GaN substrate 1 of a light-emitting diode element 14. FIG. 6(c) is a diagram showing a surface of the light-emitting diode element 14 on the principal surface side. In FIGS. 6(a) to 6(c), components which are the same as those of FIG. 4(a) to FIG. 4(c), FIG. 5(a), and FIG. 5(b) are denoted by the same marks.

As shown in FIG. 6(a), a light-emitting diode device 20 of the present embodiment has a configuration wherein a light-emitting diode element (chip) 14 is mounted on the mounting base 12. The light-emitting diode element 14 is provided on the mounting base 12 via bumps 10, 11. The bump 10 couples a p-electrode 5 of the light-emitting diode element 14 with the mounting base 12. The bump 11 couples an n-type front surface electrode 6 of the light-emitting diode element 14 with the mounting base 12.

The light-emitting diode element 14 includes an n-type GaN substrate 1 whose principal surface 1a is an m-plane, an n-type conductive layer 2 which is provided on the principal surface 1a of the n-type GaN substrate 1 and which is made of n-type GaN, and a semiconductor multilayer structure 21 which is provided on a first region 2a of the principal surface of the n-type conductive layer 2. The semiconductor multilayer structure 21 includes an active layer 3 provided on the principal surface of the n-type conductive layer 2, and a p-type conductive layer 4 which is provided on the principal surface of the active layer 3 and which is made of p-type GaN. The active layer 3 has, for example, a quantum well structure which is formed by stacked layers of, for example, InGaN and GaN. Each of the n-type conductive layer 2, the active layer 3, and the p-type conductive layer 4 is an epitaxially grown layer which is formed by means of m-plane growth. The n-type impurity concentration in the n-type GaN substrate 1 and the n-type conductive layer 2 may be, for example, not less than $1\times10^{17}$ cm$^{-3}$ and not more than $1\times10^{18}$ cm$^{-3}$.

As shown in FIG. 6(c), the p-electrode 5 is provided on the principal surface of the p-type conductive layer 4, and the n-type front surface electrode 6 is provided on a second region 2b of the principal surface of the n-type conductive layer 2. In the present embodiment, the p-electrode 5 may be formed by, for example, Pd/Pt layers. The n-type front surface electrode 6 may be formed by, for example, Ti/Al layers. However, the structures of the p-electrode 5 and the n-type front surface electrode 6 are not limited to these examples.

The n-type GaN substrate 1 and the n-type conductive layer 2 are provided with a through hole 8 penetrating through these components. The through hole 8 is filled with a conductor portion (n-type through electrode) 9 which is formed by Ti/Al layers. The conductor portion 9 is in contact with the n-type front surface electrode 6 in the second region 2b of the principal surface of the n-type conductive layer 2. On the other hand, on the rear surface 1b of the n-type GaN substrate 1, an n-type rear surface electrode 7 which is formed by Ti/Al layers is provided so as to be in contact with the conductor portion 9. As shown in FIG. 6(b), on the rear surface 1b of the n-type GaN substrate 1, the n-type rear surface electrode 7 covers the conductor portion 9. Note that FIG. 6(a) is a cross-sectional view taken along line A-A' of FIG. 6(c).

The inner wall of the through hole 8 includes a plane which is different from the m-plane. Specifically, the lateral surface of the inner wall of the through hole 8 includes the c-plane and the a-plane. The contact resistance between the +c-plane or the a-plane and the conductor portion 9 is lower than a contact resistance which is achieved when the m-plane is in contact with the n-type front surface electrode 6. In the present embodiment, the conductor portion 9, which is part of the electrode, is in contact with the inner wall of the through hole 8, so that the total contact resistance between the n-type semiconductor layer and the electrodes can be decreased. As a result, the voltage applied to the active layer can be maintained to a sufficient magnitude, and the power efficiency can be improved. Furthermore, the probability of heat generation in a low contact resistance region decreases, and accordingly, release of heat from the chip is enhanced. As a result, an increase in temperature of the active layer 3 is prevented, so that the light emission efficiency and the internal quantum efficiency can be improved. Note that the +c-plane refers to a c-plane in which Ga atoms are provided at the outermost surface, and the −c-plane refers to a c-plane in which N atoms are provided at the outermost surface.

The light-emitting diode element 14 is mounted on the mounting base 12 such that the principal surface faces downward.

The thickness of the n-type GaN substrate 1 may be decreased in some cases by polishing or etching the rear surface after the epitaxial growth step or the electrode formation step is completed. The final thickness of the n-type GaN substrate 1 is in the range from 50 μm to 250 μm, for example. Light generated in the active layer 3 is extracted through the rear surface 1b of the n-type GaN substrate 1. In this case, to improve the light extraction efficiency, it is preferred that the thickness of the n-type GaN substrate 1 is decreased as small as possible so that the absorption loss by the n-type GaN substrate 1 is reduced. Additionally considering the mechanical strength of the light-emitting diode element 14, the standard thickness of the n-type GaN substrate 1 is, for example, about 100 μm.

The thickness of the n-type conductive layer 2 corresponds to the thickness of the buffer layer in epitaxial growth on the substrate and is, specifically, about 5 μm, for example.

In some actual light-emitting diodes, an overflow stopper layer, which has the effect of preventing overflow of carriers so that the light emission efficiency is improved, may be interposed between the active layer 3 and the p-type conductive layer 4. The overflow stopper layer may be formed by, for example, an AlGaN layer. In order that more light can be extracted through the rear surface of the n-type conductive layer 2, structural measures may sometimes be devised, such as an antireflection electrode which is provided on the surface of the p-electrode 5 and which is made of silver, and a Si substrate which is placed over the surface of the pad electrode so as to prevent generation of a crack in the chip. In the present embodiment, these measures may be incorporated into the structure as necessary, although they are not shown in the drawings and the detailed descriptions thereof are herein omitted.

Figure 7:
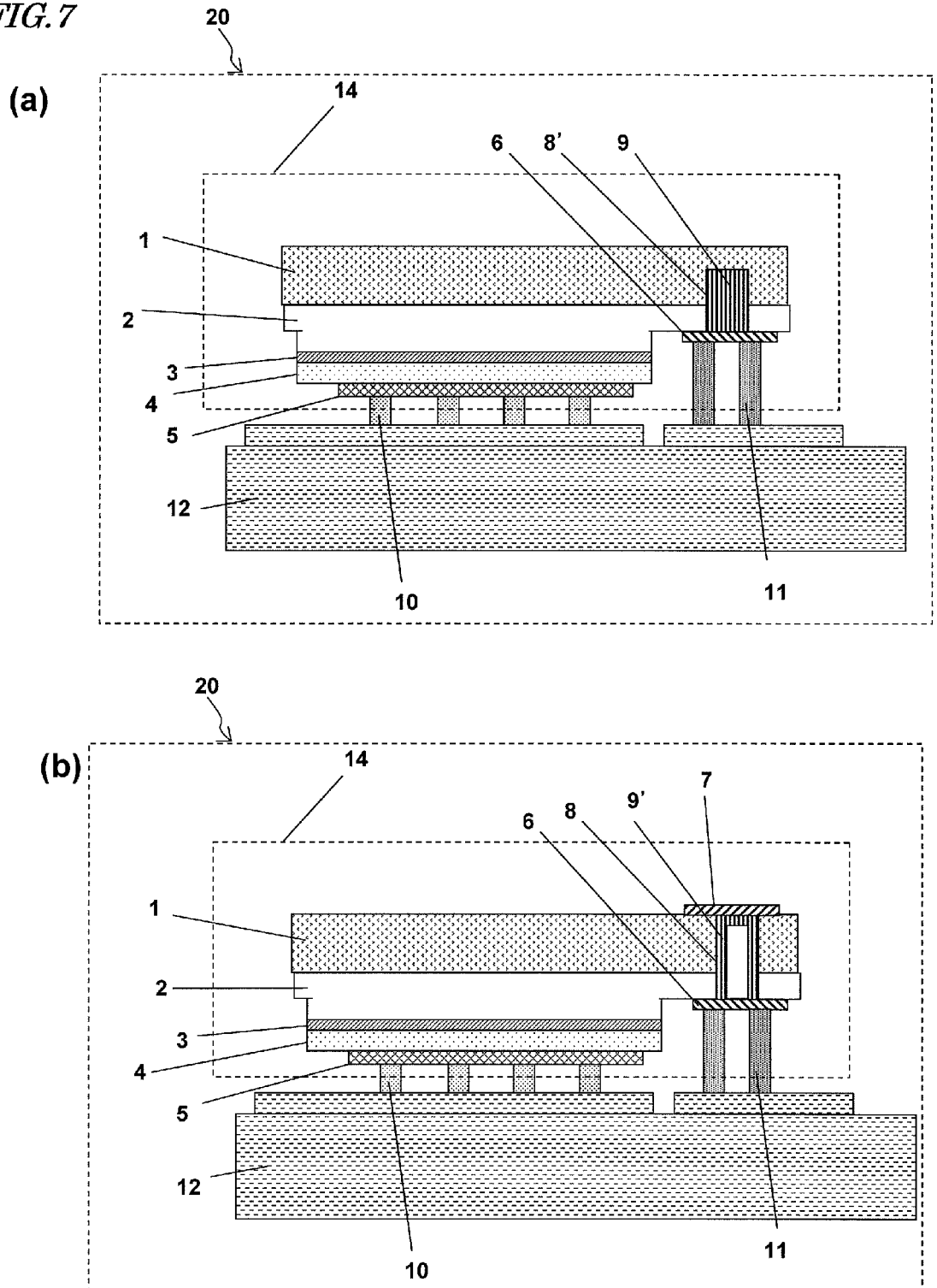
FIG. 7(a) is a cross-sectional view showing a configuration wherein a recessed portion 8' is provided in place of a through hole 8.
FIG. 7(b) is a cross-sectional view showing another configuration wherein a conductor portion 9' is provided so as to cover the inner wall of the through hole 8 and make the central portion vacant.

In the present embodiment, a recessed portion 8' such as shown in FIG. 7(a) may be provided instead of the through hole 8 penetrating through the n-type conductive layer 2 and the n-type GaN substrate 1. The conductor portion 9 may not entirely fill the through hole 8. For example, as shown in FIG. 7(b), a conductor portion 9' may be provided so as to cover the inner wall of the through hole 8. In FIG. 7(b), the inner part of the through hole 8 has a cavity.

Figure 6:
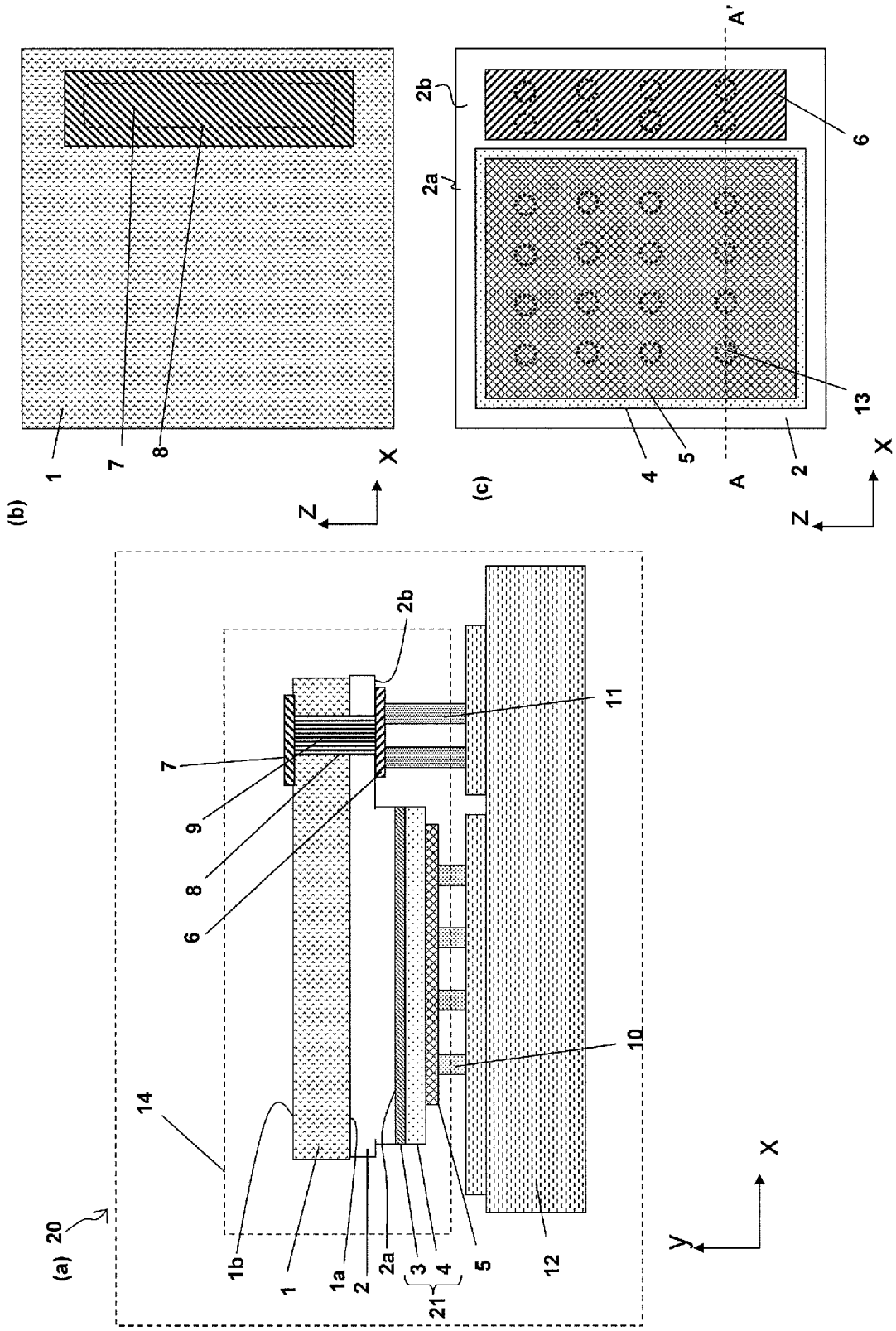
FIG. 6(a) is a cross-sectional view showing Embodiment 1 of the light-emitting diode device according to the present invention.
FIG. 6(b) is a diagram showing a rear surface 1b of an n-type GaN substrate 1 of a light-emitting diode element 14.
FIG. 6(c) is a diagram showing a surface of the light-emitting diode element 14 on the principal surface side.

Hereinafter, a preferred example of the method of fabricating a light-emitting diode element of the present embodiment is described with reference to FIG. 6.

Firstly, an n-type GaN substrate 1 is provided whose principal surface 1a is the m-plane. This n-type GaN substrate 1 may be prepared using a HVPE (Hydride Vapor Phase Epitaxy) method. For example, in the beginning, a thick GaN film, which has a thickness on the order of several micrometers, is grown on a c-plane sapphire substrate. Thereafter, the thick GaN film is cleaved at the m-plane that is vertical to the c-plane, whereby an m-plane GaN substrate is obtained. The method of preparing the GaN substrate is not limited to the above example but may be a method wherein an ingot of bulk GaN is manufactured using, for example, a liquid phase growth method, such as a sodium flux method, or a melt growth method, such as an amonothermal method, and the ingot is cleaved at the m-plane.

In the present embodiment, crystalline layers are sequentially formed on a substrate by MOCVD (Metal Organic Chemical Vapor Deposition). Firstly, on the n-type GaN substrate 1, a 3 μm thick GaN layer is formed as the n-type conductive layer 2. Specifically, a GaN layer is deposited on the n-type GaN substrate 1 by supplying TMG ($Ga(CH_3)_3$), TMA ($Al(CH_3)_3$), and $NH_3$ at 1100° C., for example. In this step, an $Al_uGa_vIn_wN$ layer ($u \geq 0$, $v \geq 0$, $w \geq 0$) may be formed as the n-type conductive layer 2, instead of the GaN layer. Note that a substrate of a different type, which is different from the n-type GaN substrate 1, may be used.

Then, an active layer 3 is formed on the n-type conductive layer 2. The active layer 3 has a 81 nm thick GaInN/GaN multi-quantum well (MQW) structure which is realized by, for example, alternately stacking 9 nm thick $Ga_{0.9}In_{0.1}N$ well layers and 9 nm thick GaN barrier layers. In forming the $Ga_{0.9}In_{0.1}N$ well layers, it is preferred to decrease the growth temperature to 800° C. in order to enhance incorporation of In.

On the active layer 3, a 70 nm thick p-type conductive layer 4 of GaN is formed by supplying TMG, TMA, $NH_3$, and $Cp_2Mg$ (cyclopentadienyl magnesium) as the p-type impurity. The p-type conductive layer 4 preferably has an unshown p-GaN contact layer at the surface. As the p-type conductive layer 4, for example, a p-$Al_{0.14}Ga_{0.86}N$ layer may be formed instead of the GaN layer.

After the end of the above-described epitaxial growth step by means of MOCVD, chlorine dry etching is performed to partially remove the p-type conductive layer 4 and the active layer 3 such that a recessed portion is formed, whereby the second region 2b of the n-type conductive layer 2 is exposed.

Then, the through hole 8 is formed using a dry etching process, for example. Specifically, a resist mask is formed over the principal surfaces of the p-type conductive layer 4 and the n-type conductive layer 2, and thereafter, an opening is formed in part of the resist mask which is assigned for formation of the through hole 8. By performing dry etching using the resultant resist mask, a hole can be formed through the n-type conductive layer 2 and the n-type GaN substrate 1, which serves as the through hole 8. For example, when the hole reaches the depth of 100 μm, the dry etching is stopped before the hole thoroughly penetrates through the n-type GaN substrate 1. As shown in FIG. 6(b), the through hole 8 is formed to have a rectangular shape when seen in a direction perpendicular to the principal surface of the n-type conductive layer 2. In this step, by modifying the orientation of the respective sides of the rectangle, the +c-plane, the −c-plane and the a-plane, which are perpendicular to the m-plane, can appear on the inner walls of the through hole 8. The dimension of the through hole 8 (the dimension in a plane which is parallel to the principal surface) is preferably 100 μm×270 μm, for example.

Then, a 10 nm thick Ti layer and a 100 nm thick Al layer are formed, by evaporation or sputtering, over the lateral wall and the bottom of the above-described hole that is to serve as the through hole 8. Then, on the resultant layers, another Al layer is stacked by plating, whereby the conductor portion 9 is formed. In this step, the conductor portion 9 may be formed so as to entirely fill the inside of the through hole 8. Alternatively, as shown in FIG. 7(b), a conductor portion 9' may be formed so as to cover the inner wall of the through hole 8, with a cavity left at the center. In order that the above-described Ti/Al layers are uniformly formed over the inner wall, the dimension of the through hole 8 in a plane which is parallel to the principal surface is desirably adjusted so as to be equal to or greater than the dimension of the through hole 8 in a vertical plane.

Then, on the second region 2b of the n-type conductive layer 2, the n-type front surface electrode 6 is formed by, for example, a 10 nm thick Ti layer and a 100 nm thick Al layer. The n-type front surface electrode 6 is formed so as to be in contact with the conductor portion 9. On the other hand, the p-electrode 5 is formed on the p-type conductive layer 4.

Then, the n-type GaN substrate 1 is polished at the rear surface such that the conductor portion 9 is exposed. Thereafter, by evaporation or the like, the n-type rear surface electrode 7 is formed on the rear surface 1b of the n-type GaN substrate 1. The n-type rear surface electrode 7 is formed by a 10 nm thick Ti layer and a 100 nm thick Al layer. In the case where the recessed portion 8' shown in FIG. 7(a) is formed instead of the through hole 8, any modification may be made, such as decreasing the depth of the hole, increasing the thickness of the substrate obtained after the polishing, or the like.

Then, a heat treatment is performed at 450° C. for about 15 minutes. This heat treatment can reduce the contact resistance between the semiconductor layer and the electrode. This heat treatment may be performed at a temperature of about 450° C. to 650° C. for about 5 minutes to 20 minutes.

The foregoing descriptions are merely illustration of an example of a preferred embodiment.

Figure 8:
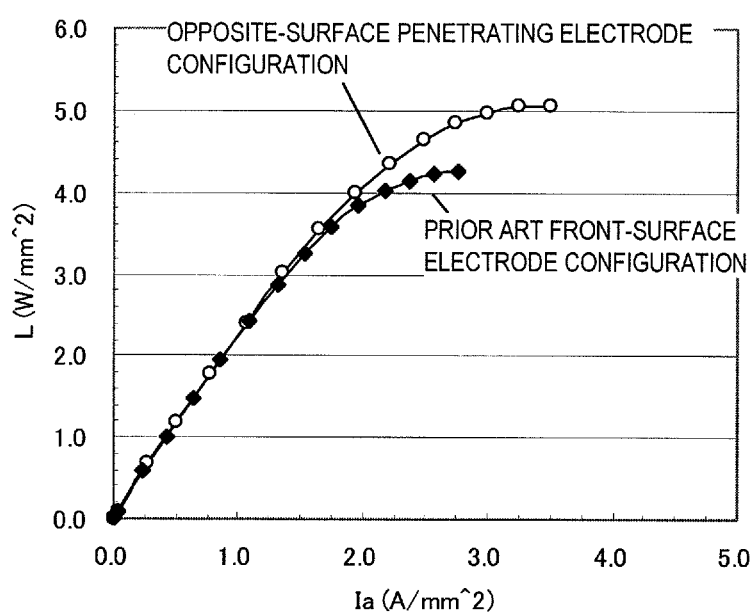
FIG. 8 is a graph showing the simulation results of the electric current dependence of the light output from a GaN-based light-emitting diode.

FIG. 8 is a graph showing the simulation results of the electric current dependence of the light output from a GaN-based light-emitting diode. In FIG. 8, the horizontal axis represents the current value per unit area, Ia ($A/mm^2$), of an electric current flowing through an anode electrode, and the vertical axis represents the light output per unit area (W/mm²). The simulation result of the prior art shown in FIG. 8 was obtained using a light-emitting diode which had the front-surface electrode configuration shown in FIGS. 5(a) and 5(b). As seen from FIG. 8, in the present embodiment, a greater light output was achieved with the same electric current as compared with the prior art, so that the efficiency was improved.

In the present embodiment, the through hole 8 is provided in the n-type GaN substrate 1 which has the m-plane principal surface and the n-type conductive layer 2, so that a plane which is different from the m-plane can appear on the inner wall of the through hole 8. Specifically, the c-plane or the a-plane can appear on the inner wall of the through hole 8. The contact resistance between the +c-plane or the a-plane and the conductor portion 9 is lower than the contact resistance that is obtained when an m-plane nitride semiconductor layer is in contact with the n-type front surface electrode 6. The conductor portion 9, which is part of the electrode, is configured to be in contact with the inner wall of the through hole 8, whereby the total contact resistance between the n-type semiconductor layer and the electrodes can be decreased. Further, the n-type semiconductor layer and the electrode may be configured to be in contact with each other at the inner wall of the through hole 8 and the rear surface of the n-type GaN substrate 1, so that the contact area of the n-type semiconductor layer and the electrode can be increased as compared with the prior art configuration. Increasing the contact area in such a way can also decrease the total contact resistance between the n-type semiconductor layer and the electrodes. As a result, the voltage applied to the active layer can be maintained to a sufficient magnitude, and the power efficiency can be improved. Furthermore, the probability of heat generation in a low contact resistance region decreases, and in addition, by increasing the contact area of the n-type semiconductor layer and the electrode, release of heat from the chip is enhanced. As a result, an increase in temperature of the active layer 3 is prevented, so that the light emission efficiency and the internal quantum efficiency can be improved. Further, with the presence of the conductor portion 9 that is in contact with the inner wall of the through hole 8 and the n-type rear surface electrode 7, the current path to the active layer can be broader. The reliability can be improved by the uniform current path, whereas in the prior art configuration a problem of electrode breakage due to concentration of the current at the edge of the n-type front surface electrode 6 sometimes occurs.

The +c-plane before the heat treatment (as-depo) exhibits high contact resistance. However, after the heat treatment at about 450° C. for 15 minutes, the +c-plane exhibits low contact resistance, which is specifically $5\times10^{-5}$ Ω·cm² (in the case where Ti/Al/Pt layers are formed as the electrode on the +c-plane). The contact resistance of the +c-plane is about 1/10 to about 1/5 of the contact resistance of the m-plane. Since the +c-plane is perpendicular to the m-plane and thus readily appears when the etching is performed, in a GaN-based semiconductor layer whose principal surface is the m-plane, the +c-plane can readily appear on the inner wall. Thus, it is particularly desirable that the lateral surface of the inner wall of the through hole 8 includes the +c-plane.

On the other hand, the −c-plane before the heat treatment (as-depo) exhibits relatively low contact resistance, which is specifically $7\times10^{-4}$ Ω/cm² (in the case where Ti/Al layers are formed as the electrode on the −c-plane). However, by performing the heat treatment, the contact resistance of the −c-plane increases to $1\times10^{-3}$ to $1\times10^{-2}$ Ω/cm². When the surface of the semiconductor layer on which the −c-plane appears is treated by dry etching or deposition of SiO₂, the increase of the contact resistance can be reduced to some extent. However, even if the surface treatment is performed, the contact resistance of the −c-plane is not less than 10 times the contact resistance of the +c-plane. However, even when the −c-plane appears on the inner wall of the through hole 8, the total contact resistance can be decreased by making the contact area of the n-type semiconductor layer and the electrodes greater than that of the prior art configuration which does not have the through hole 8.

The mechanism through which the contact resistance increases or decreases by means of the heat treatment may be as explained below. In the +c-plane, N atoms are readily diffused by the heat treatment even though the atoms at the outermost surface are Ga atoms. Since nitrogen vacancies that serve as the donors are readily formed, an n-type contact resistance can readily be obtained by the heat treatment. On the other hand, in the −c-plane, in reverse, Ga atoms are readily released by the heat treatment even though the atoms at the outermost surface are N atoms. It is inferred that, since Ga vacancies that serve as the acceptors are formed, the contact resistance is disadvantageously increased by the heat treatment. It is inferred that, when a surface treatment, such as dry etching, is performed on the −c-plane, nitrogen vacancies are formed, so that the contact resistance decreases.

The contact resistance of the a-plane against the Ti/Al layers is from ½ to ⅓ of that obtained in the case of the m-plane.

Embodiment 2

Figure 9:
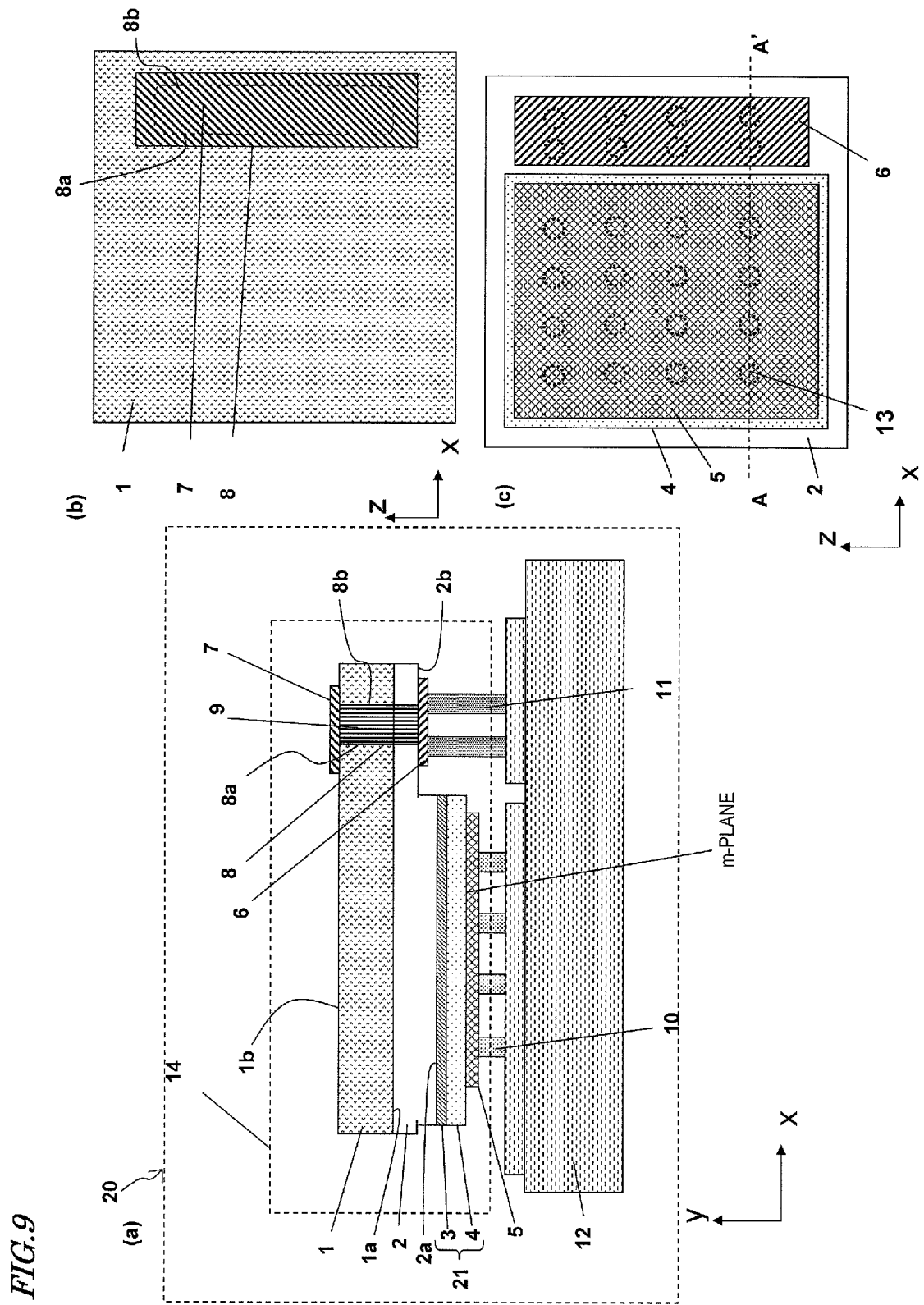
FIG. 9(a) is a cross-sectional view showing Embodiment 2 of the light-emitting diode device according to the present invention.
FIG. 9(b) is a diagram showing a rear surface 1b of an n-type GaN substrate 1 shown in FIG. 9(a).
FIG. 9(c) is a diagram showing a surface of a light-emitting diode element 14 shown in FIG. 9(a) which is on the principal surface side.

FIG. 9(a) is a cross-sectional view showing Embodiment 2 of the light-emitting diode device according to the present invention. FIG. 9(b) is a diagram showing a rear surface 1b of an n-type GaN substrate 1 shown in FIG. 9(a). FIG. 9(c) is a diagram showing a surface of a light-emitting diode element 14 shown in FIG. 9(a) which is on the principal surface side. In FIGS. 9(a) to 9(c), components which are the same as those of FIGS. 6(a) to 6(c) are denoted by the same marks.

As shown in FIG. 9(a), in the present embodiment, the +c-plane 8a and the −c-plane 8b appear on the lateral surfaces of the inner walls of the through hole 8. The +c-plane 8a is located at a position closer to the active layer 3 than the −c-plane 8b. As described above, after the heat treatment, the +c-plane exhibits low contact resistance, which is 1/10 to about 1/5 of the contact resistance obtained in the case of the m-plane. In this way, the +c-plane is provided on a side where a larger electric current flows, so that the total contact resistance can further be reduced. Note that the plane appearing on the other lateral surfaces of the inner walls of the through hole 8 other than the +c-plane and −c-plane lateral surfaces is a-plane.

The present embodiment has the same configuration as that of Embodiment 1 except for the arrangement of the through hole 8 and the active layer 3. The descriptions of the same aspects of the configuration are omitted herein.

Figure 10:
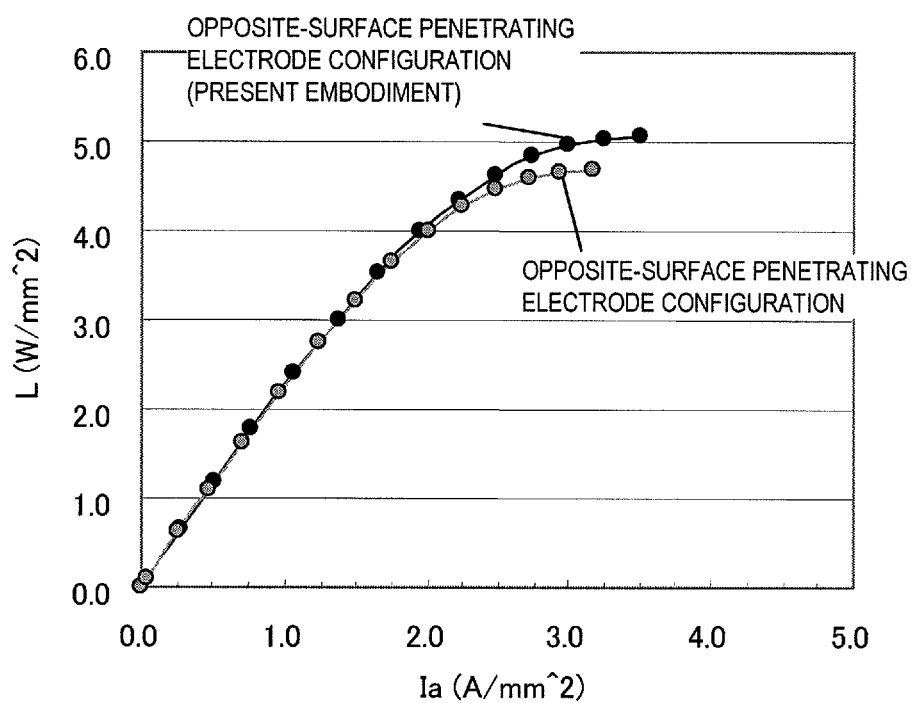
FIG. 10 is a graph showing the simulation results of the electric current dependence of the light output from a GaN-based light-emitting diode.

FIG. 10 is a graph showing the simulation results of the electric current dependence of the light output from a GaN-based light-emitting diode. FIG. 10 shows the simulation result of the present embodiment and the simulation result of a light-emitting diode wherein the contact resistance of the n-electrode is 5 times that of the present embodiment (comparative example). In the present embodiment, a greater light output was achieved with the same electric current as compared with the comparative example, so that the efficiency was improved.

In the present embodiment, the same effects as those of Embodiment 1 can be achieved. Particularly, in the present embodiment, the +c-plane that exhibits the lowest contact resistance is closer to the active layer 3, so that the total contact resistance can further be reduced as compared with Embodiment 1.

Note that the contact resistance of the a-plane is smaller than the contact resistance of the −c-plane. Therefore, at the lateral wall of the through hole 8, the a-plane may be located in the vicinity of the active layer 3 while the −c-plane may be located at a position away from the active layer 3.

Embodiment 3

Figure 11:
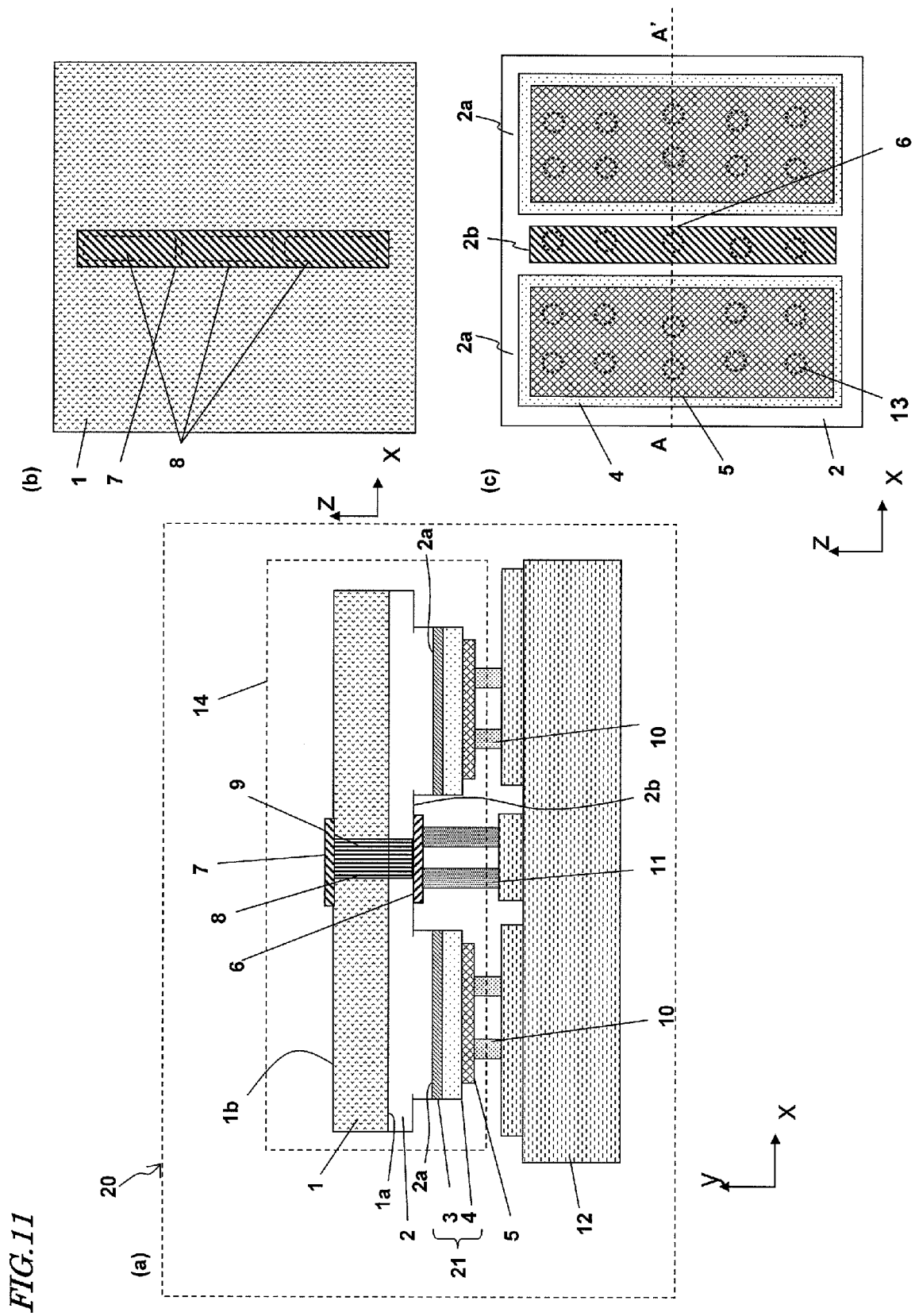
FIG. 11(a) is a cross-sectional view showing Embodiment 3 of the light-emitting diode device according to the present invention.
FIG. 11(b) is a diagram showing a rear surface 1b of an n-type GaN substrate 1 shown in FIG. 11(a).
FIG. 11(c) is a diagram showing a surface of a light-emitting diode element 14 shown in FIG. 11(a) which is on the principal surface side.

FIG. 11(a) is a cross-sectional view showing Embodiment 3 of the light-emitting diode device according to the present invention. FIG. 11(b) is a diagram showing a rear surface 1b of an n-type GaN substrate 1 shown in FIG. 11(a). FIG. 11(c) is a diagram showing a surface of a light-emitting diode element 14 shown in FIG. 11(a) which is on the principal surface side. In FIGS. 11(a) to 11(c), components which are the same as those of FIGS. 6(a) to 6(c) are denoted by the same marks.

As shown in FIGS. 11(a) to 11(c), in the present embodiment, through holes 8 are provided in a central portion of the chip (a central portion in terms of the x direction). At opposite sides of a region in which the through holes 8 are provided (the opposite sides of the chip in terms of the x direction), the active layer 3 and the p-type conductive layer 4 are positioned. As shown in FIG. 11(b), three through holes 8 are aligned along the z direction. The upper openings of the three through holes 8 (the openings in the rear surface) are covered with the n-type rear surface electrode 7. The present embodiment has the same configuration as that of Embodiment 1 except for the number and the arrangement of the through holes 8. The descriptions of the same aspects of the configuration are omitted herein.

In the present embodiment, the statement, "the through holes 8 are provided in a central portion of the chip", means that the active layer 3 and the p-type conductive layer 4 are provided at the opposite sides of the through holes 8 in terms of the x direction or at the opposite sides of the through holes 8 in terms of the z direction (shown in FIG. 11(b)).

Figure 5:
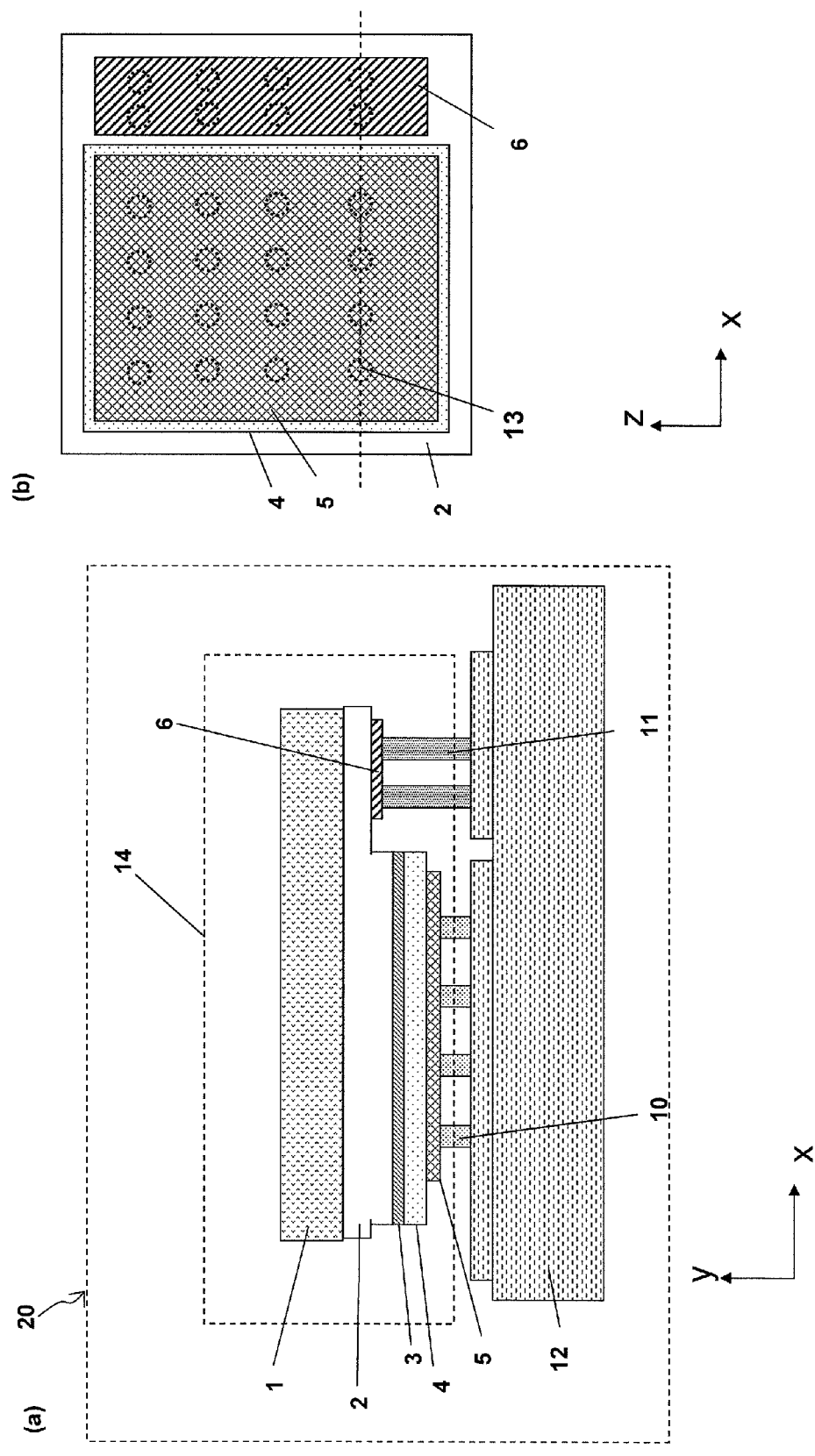
FIG. 5(a) is a cross-sectional view showing a light-emitting diode element of the front-surface electrode type which is mounted on the mounting base 12.
FIG. 5(b) is a side view of the light-emitting diode element of the front-surface electrode type, which is seen from the side including a p-electrode 5 and an n-type front surface electrode 6.

In FIG. 5, the n-type impurity concentration of the n-type conductive layer 2 is, for example, not less than $1 \times 10^{17}$ cm$^{-3}$ and not more than $2 \times 10^{18}$ cm$^{-3}$. The thickness of the n-type GaN substrate 1 is about 100 μm. The thickness of the n-type conductive layer 2 is, for example, about 5 μm. The through holes 8 may be formed using a dry etching process.

In the present embodiment, the same effects as those of Embodiment 1 can be achieved. Furthermore, in the present embodiment, the conductor portion 9 that has higher thermal conductivity than GaN is provided in a central portion of the chip. Therefore, the heat which would otherwise be likely to stay in the central portion of the chip can be acceleratedly released out of the chip via the conductor portion 9.

In a GaN-based LED whose principal surface is the m-plane, it is difficult to increase the impurity concentration of the n-type conductive layer and the n-type GaN substrate, and the resistance of these layers is likely to increase. Therefore, there is a problem that a sufficient voltage cannot be applied to the active layer that is far distant from the n-electrode. In the present embodiment, the through electrode 9 is provided in the central portion of the chip, whereby the distance from the conductor portion 9 to the active layer 3 can be decreased when considered with equal chip areas. This configuration enables application of a sufficient voltage to the active layer 3. As a result, the current injection to the active layer 3 becomes uniform irrespective of the position. Thus, a greater light output is achieved with the same electric current, so that the efficiency is improved.

Figure 12:
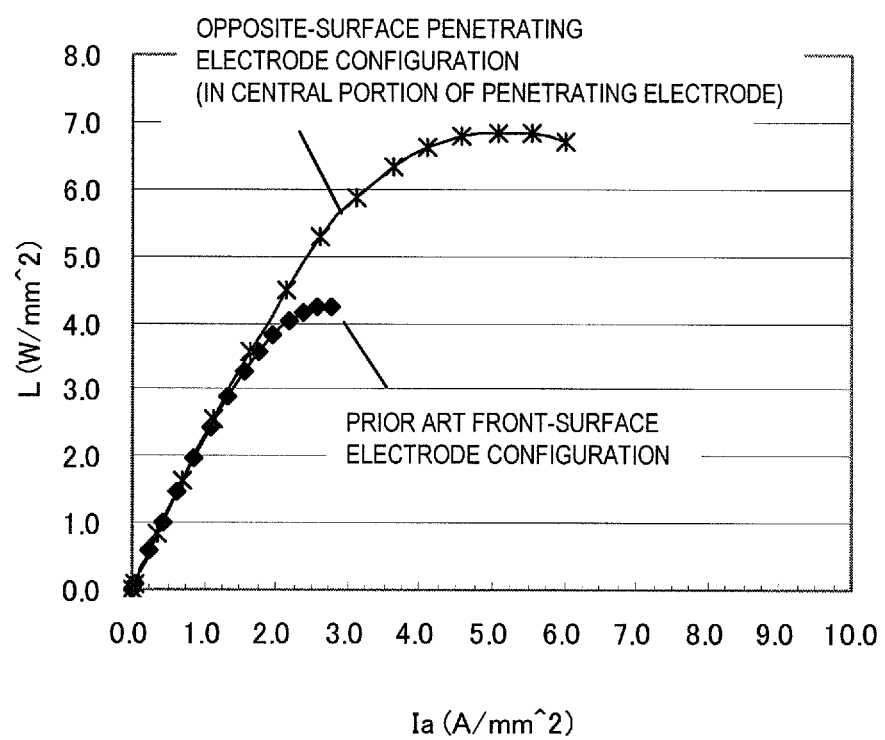
FIG. 12 is a graph showing the simulation results of the electric current dependence of the light output from a GaN-based light-emitting diode.

FIG. 12 is a graph showing the simulation results of the electric current dependence of the light output from a GaN-based light-emitting diode. The simulation result of the prior art shown in FIG. 12 was obtained using a light-emitting diode which had the front-surface electrode configuration shown in FIGS. 5(a) and 5(b). As seen from FIG. 12, in the present embodiment, a greater light output was achieved with the same electric current as compared with the prior art, so that the efficiency was improved. Comparing with the simulation result of Embodiment 1 shown in FIG. 8, when the value of the horizontal axis is large, the value of the light output is greater in the present embodiment. For example, when the value of the horizontal axis is 3 (A/mm$^2$), the value of the light output is close to 6 W/mm$^2$ in the present embodiment, whereas the value of the light output is 5 W/mm$^2$ in Embodiment 1. This is probably attributed to the configuration wherein the conductor portion 9 is provided in the central portion of the chip, so that the heat releasability is improved, and the voltage applied to the active layer 3 becomes uniform. In the present embodiment, the heat releasability is improved, and the current injection to the active layer 3 becomes uniform irrespective of the position, so that a greater light output is achieved with the same electric current, and the efficiency is improved.

Embodiment 4

FIG. 13(a) is a cross-sectional view showing Embodiment 4 of the light-emitting diode device according to the present invention. FIG. 13(b) is a diagram showing a rear surface 1b of an n-type GaN substrate 1 shown in FIG. 13(a). FIG. 13(c) is a diagram showing a surface of a light-emitting diode element 14 shown in FIG. 13(a) which is on the principal surface side. In FIGS. 13(a) to 13(c), components which are the same as those of FIGS. 6(a) to 6(c) are denoted by the same marks.

As shown in FIGS. 13(a) to 13(c), in the present embodiment, the through hole 8 is provided in a central portion of the chip (in a central portion in terms of the x direction). When seen in a direction perpendicular to the principal surface of the n-type conductive layer 2 (y direction), the through hole 8 and the n-type front surface electrode 6 have a rectangular planar shape which has long sides extending along the z direction and short sides extending along the x direction. The four corners of the rectangular through hole 8 may be rounded. As shown in FIG. 13(b), the inner wall of the through hole 8 includes the a-planes 8c, 8d, the +c-plane 8a, and the −c-plane 8b. On the other hand, the p-electrode 5, the p-type conductive layer 4, and the active layer 3 have a square-shaped or rectangular-shaped recess. Note that the through hole 8 and the n-type front surface electrode 6 may have a square shape. Alternatively, they may have a rectangular planar shape which has long sides extending along the x direction and short sides extending along the z direction.

When seen in a direction perpendicular to the principal surface of the n-type conductive layer 2 (y direction), as shown in FIG. 13(c), the p-electrode 5 has a side 5c corresponding to a side defined by the a-plane 8c at the lateral surface of the inner wall of the through hole 8, a side 5d corresponding to a side defined by the a-plane 8d, and a side 5a corresponding to a side defined by the +c-plane 8a. On the other hand, the −c-plane 8b at the lateral surface of the inner wall of the through hole 8 is provided at an edge of the chip, and the p-electrode 5 does not have a side corresponding to a side defined by the −c-plane 8b. Since the active layer 3 has a similar planar shape to that of the p-electrode 5, the active layer 3 also have sides corresponding to the sides defined by respective ones of the a-planes 8c, 8d and the +c-plane 8a but does not have a side corresponding to the side defined by the −c-plane 8b. The present embodiment has the same configuration as that of Embodiment 1 except for the location at which the through hole 8 is provided and the plane orientations of the inner wall of the through hole 8. The descriptions of the same aspects of the configuration are omitted herein.

The −c-plane exhibits large contact resistance as compared with the +c-plane and the a-plane. Therefore, the lateral surfaces of the +c-plane and the a-plane are provided in the vicinity of the active layer 3 while the lateral surface of the −c-plane is provided distant from the active layer 3, whereby a greater electric current flows through the lateral surfaces of the +c-plane and the a-plane. As a result, the total contact resistance further decreases.

Figure 13:
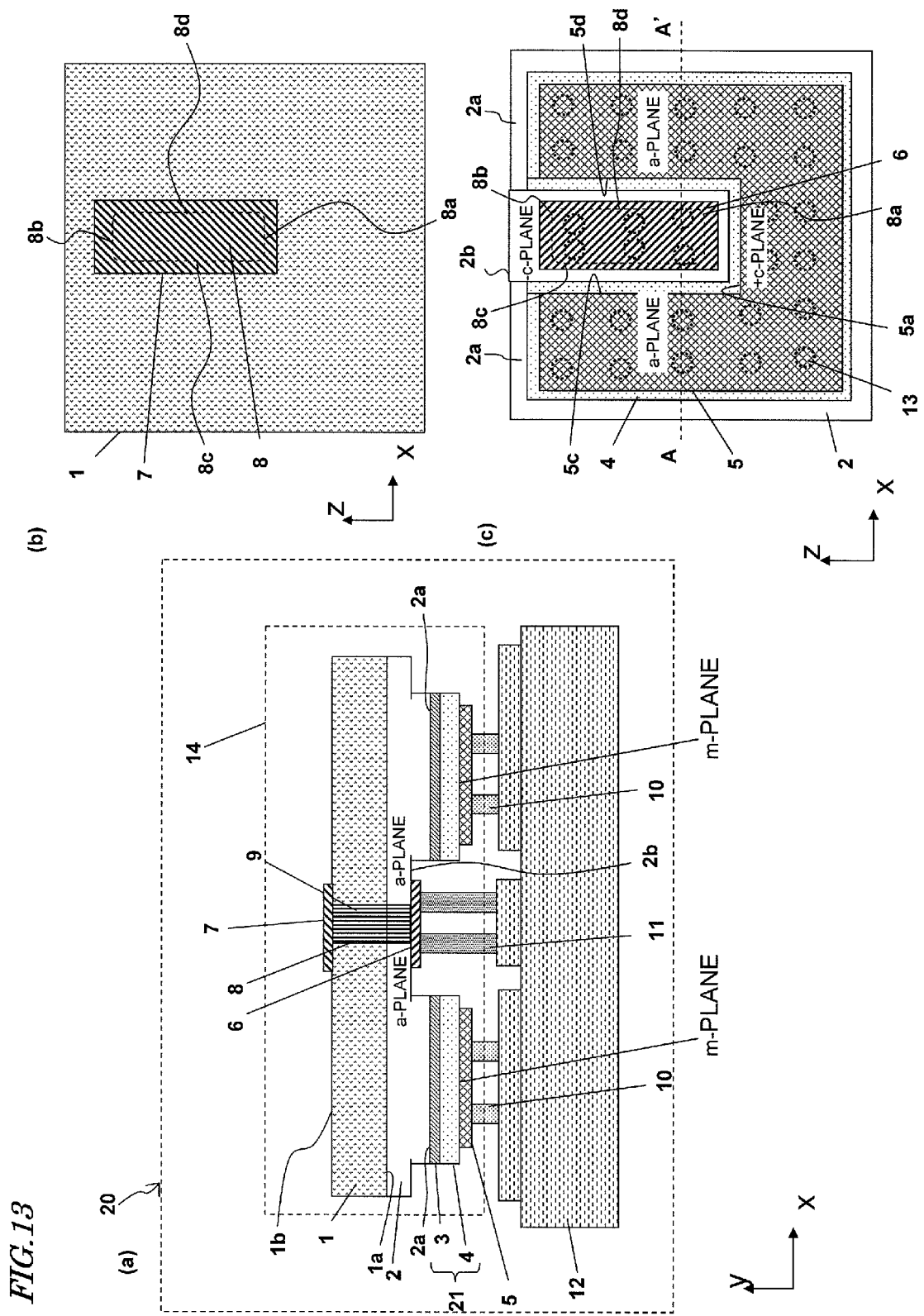
FIG. 13(a) is a cross-sectional view showing Embodiment 4 of the light-emitting diode device according to the present invention.
FIG. 13(b) is a diagram showing a rear surface 1b of an n-type GaN substrate 1 shown in FIG. 13(a).
FIG. 13(c) is a diagram showing a surface of a light-emitting diode element 14 shown in FIG. 13(a) which is on the principal surface side.

In FIG. 13, the impurity concentration of the n-type conductive layer 2 is, for example, not less than $1 \times 10^{17}$ cm$^{-3}$ and not more than $2 \times 10^{18}$ cm$^{-3}$. The thickness of the n-type GaN substrate 1 is about 100 μm. The thickness of the n-type conductive layer 2 is, for example, about 5 μm.

The through hole 8 may be formed using a dry etching process. In this step, the dry etching is performed such that the inner wall of the through hole 8 extends along the c-axis direction (z direction in FIG. 13(b)) and along the a-axis direction (x direction in FIG. 13(b)). At the inner wall of the through hole 8, if the +c-plane appears on one of opposite lateral surfaces, the −c-plane appears on the other lateral surface. In the present embodiment, the lateral surface of the −c-plane needs to be provided distant from the active layer 3, and thus, the through hole 8 is arranged such that the −c-plane lateral surface is located near an edge of the chip.

In the present embodiment, the same effects as those of Embodiment 3 can be achieved. Furthermore, in the present embodiment, the lateral surfaces of the +c-plane and the a-plane are provided in the vicinity of the active layer 3, while the lateral surface of the −c-plane is provided distant from the active layer 3. Therefore, the total contact resistance further decreases as compared with Embodiment 3.

In the present embodiment, the active layer 3 is formed to have a square-shaped or rectangular-shaped recess accommodating the through hole 8, whereas in Embodiment 3 the through holes 8 are provided in a central portion of the chip and the active layer 3 is provided at the opposite sides of the through holes 8. Thus, in the present embodiment, the area of the active layer 3 can be large as compared with Embodiment 3, so that a greater light output is achieved.

Embodiment 5

Figure 14:
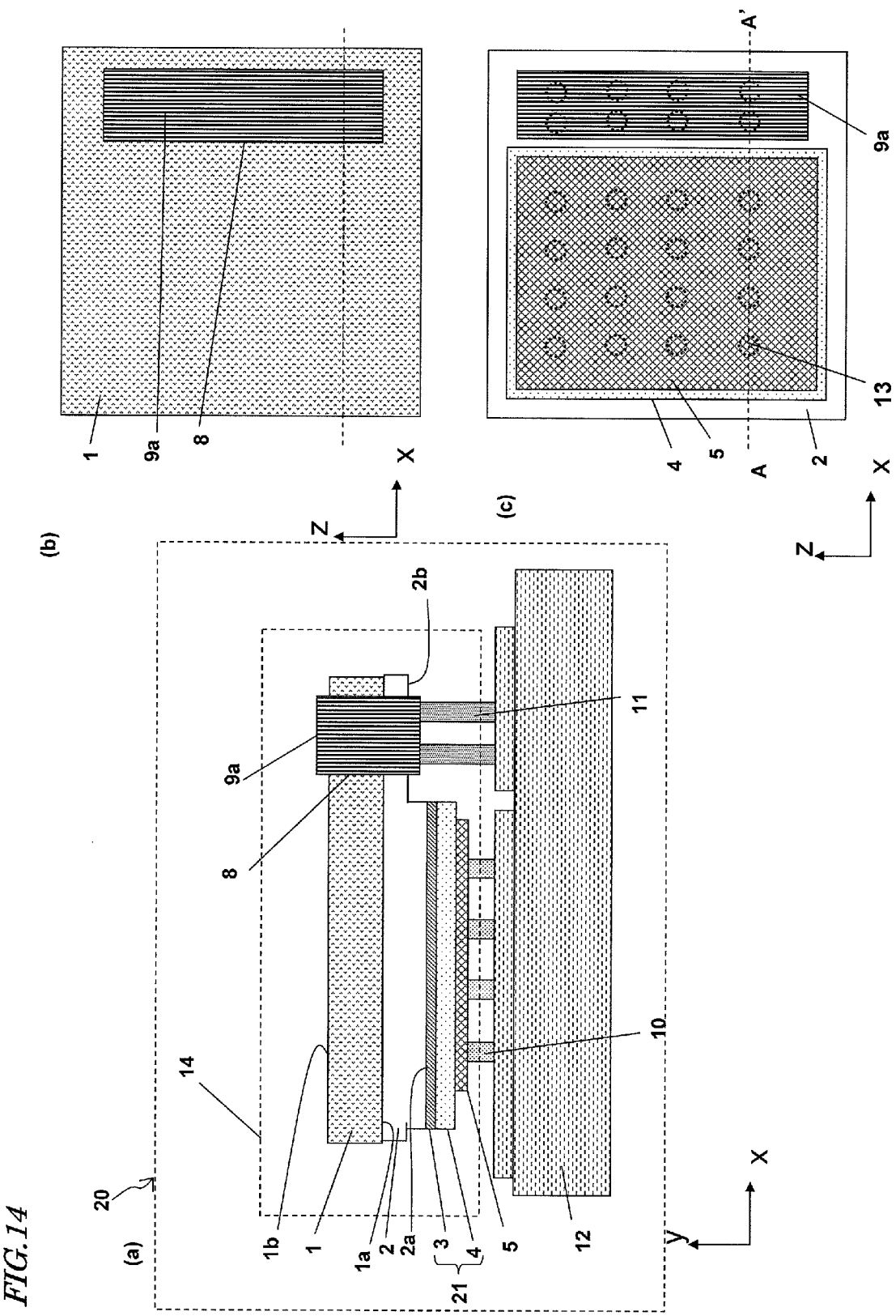
FIG. 14(a) is a cross-sectional view showing Embodiment 5 of the light-emitting diode device according to the present invention.
FIG. 14(b) is a diagram showing a rear surface 1b of an n-type GaN substrate 1 shown in FIG. 14(a).
FIG. 14(c) is a diagram showing a surface of a light-emitting diode element 14 shown in FIG. 14(a) which is on the principal surface side.

FIG. 14(a) is a cross-sectional view showing Embodiment 5 of the light-emitting diode device according to the present invention. FIG. 14(b) is a diagram showing a rear surface of an n-type GaN substrate 1 shown in FIG. 14(a). FIG. 14(c) is a diagram showing a surface of a light-emitting diode element 14 shown in FIG. 14(a) which is on the principal surface side. In FIGS. 14(a) to 14(c), components which are the same as those of FIGS. 6(a) to 6(c) are denoted by the same marks.

As shown in FIGS. 14(a) to 14(c), the present embodiment does not include the n-type front surface electrode 6 and the n-type rear surface electrode 7 that are shown in FIGS. 6(a) to 6(c). In the present embodiment, a conductor portion 9a provided in the through hole 8 fulfills the roles of the n-type front surface electrode 6 and the n-type rear surface electrode 7. In other words, the conductor portion 9, the n-type front surface electrode 6 and the n-type rear surface electrode 7 are integrally formed of the same metal material.

In the configuration shown in FIG. 14(a), the conductor portion 9a is protruding beyond the rear surface of the n-type GaN substrate 1 and the second region 2b of the second conductive layer 2. Note that, however, the conductor portion 9 does not need to have a protruding structure.

The present embodiment has the same configuration as that of Embodiment 1 except for the structures of the conductor portion 9a, the n-type front surface electrode 6, and the n-type rear surface electrode 7. The descriptions of the same aspects of the configuration are omitted herein.

The through hole 8 may be formed using a dry etching process. In the present embodiment, the area of the opening of the through hole 8 is equal to the area of the n-type front surface electrode 6 and to the area of the n-type rear surface electrode 7. The dimension of the through hole (the dimension in a plane which is parallel to the principal surface) is preferably 100 μm×300 μm, for example. The conductor portion 9 may be formed by depositing Ti/Al layers by means of evaporation, sputtering, or plating.

The impurity concentration of the n-type GaN substrate 1 and the n-type conductive layer 2 is not less than $1 \times 10^{17}$ cm$^{-3}$ and not more than $2 \times 10^{18}$ cm$^{-3}$. The thickness of the n-type GaN substrate 1 is, for example, about 100 μm. The thickness of the n-type conductive layer 2 corresponds to the thickness of the buffer layer in epitaxial growth on the n-type GaN substrate 1 and is, specifically, about 5 μm, for example.

In the present embodiment, the through hole 8 is provided in the n-type GaN substrate 1 which has the m-plane principal surface and the n-type conductive layer 2, so that the c-plane or the a-plane can appear on the inner wall of the through hole 8. The contact resistance between the +c-plane or the a-plane and the conductor portion 9 is lower than the contact resistance that is obtained when the m-plane is in contact with the n-type front surface electrode 6. The conductor portion 9, which is part of the electrode, is configured to be in contact with the inner wall of the through hole 8, whereby the total contact resistance between the n-type semiconductor layer and the electrodes can be decreased. As a result, the voltage applied to the active layer can be maintained to a sufficient magnitude, and the power efficiency can be improved. Furthermore, the probability of heat generation in a low contact resistance region decreases. As a result, an increase in temperature of the active layer 3 is prevented, so that the light emission efficiency and the internal quantum efficiency can be improved. Further, with the presence of the conductor portion 9 that is in contact with the inner wall of the through hole 8, the current path to the active layer can be broader. Thus, the reliability can be improved by the uniform current path, whereas in the prior art configuration a problem of electrode breakage due to concentration of the current at the edge of the n-type front surface electrode 6 sometimes occurs.

The present embodiment does not include the n-type front surface electrode 6 and the n-type rear surface electrode 7 such as provided in Embodiment 1. Therefore, the contact area of the n-type semiconductor layer and the electrode is small as compared with Embodiment 1. Thus, when the −c-plane that exhibits higher contact resistance than the m-plane is provided on a side closer to the active layer 3, the heat releasability and the resistance decreasing effect cannot be sufficiently obtained. Therefore, it is preferred that the −c-plane at the inner wall of the through hole 8 is provided on a side which is distant from the active layer 3.

Figure 15:
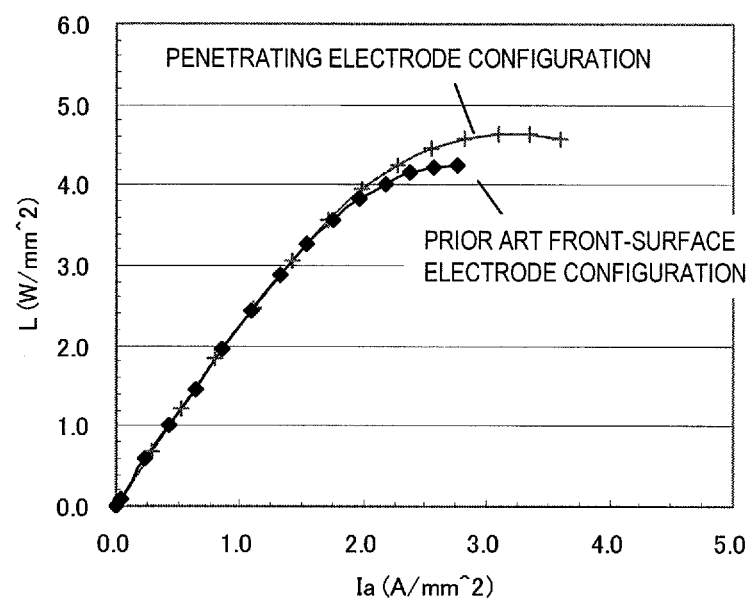
FIG. 15 is a graph showing the simulation results of the electric current dependence of the light output from a GaN-based light-emitting diode.

FIG. 15 is a graph showing the simulation results of the electric current dependence of the light output from a GaN-based light-emitting diode. The simulation result of the prior art shown in FIG. 12 was obtained using a light-emitting diode which had the front-surface electrode configuration shown in FIGS. 5(a) and 5(b). As seen from FIG. 15, in the present embodiment, a greater light output was achieved with the same electric current as compared with the prior art, so that the efficiency was improved.

Embodiment 6

Figure 16:
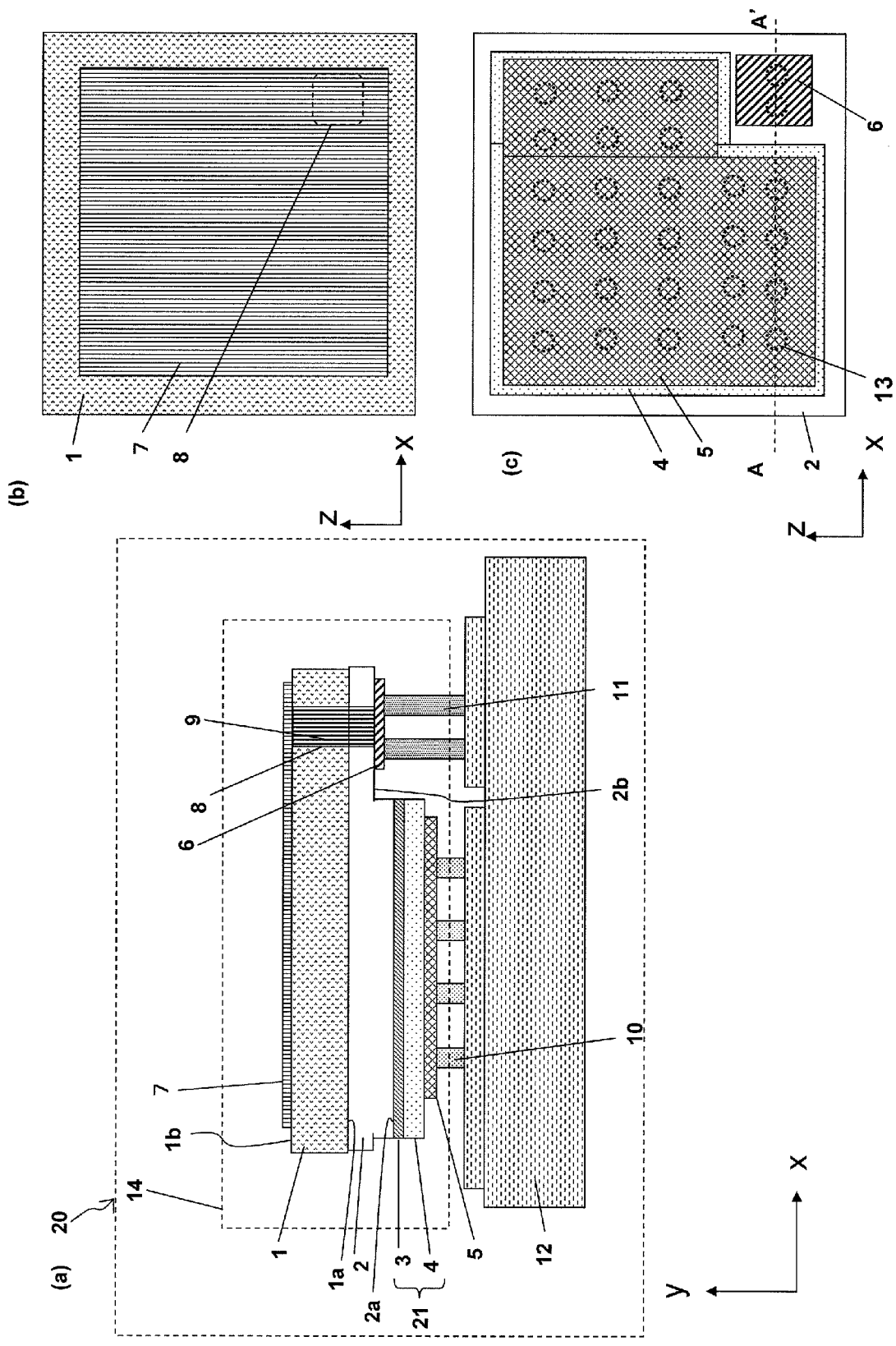
FIG. 16(a) is a cross-sectional view showing Embodiment 6 of the light-emitting diode device according to the present invention.
FIG. 16(b) is a diagram showing a rear surface 1b of an n-type GaN substrate 1 shown in FIG. 16(a).
FIG. 16(c) is a diagram showing a surface of a light-emitting diode element 14 shown in FIG. 16(a) which is on the principal surface side.

FIG. 16(a) is a cross-sectional view showing Embodiment 6 of the light-emitting diode device according to the present invention. FIG. 16(b) is a diagram showing a rear surface 1b of an n-type GaN substrate 1 shown in FIG. 16(a). FIG. 16(c) is a diagram showing a surface of a light-emitting diode element 14 shown in FIG. 16(a) which is on the principal surface side. In FIGS. 16(a) to 16(c), components which are the same as those of FIGS. 6(a) to 6(c) are denoted by the same marks.

As shown in FIGS. 16(a) to 16(c), in the present embodiment, when seen in a direction perpendicular to the principal surface of the n-type conductive layer 2 (y direction), a through hole 8 is provided at a corner portion of a chip that has a quadrangular planar shape. The p-electrode 5, the p-type conductive layer 4, and the active layer 3 are provided in part of the chip excluding the corner portion where the through hole 8 is provided. Also, in the present embodiment, on the rear surface 1b of the n-type GaN substrate 1, the n-type rear surface electrode 7 is formed of a transparent material, such as ITO (Indium Tin Oxide). The n-type rear surface electrode 7 is provided at a position so as to oppose the p-electrode 5, with the active layer 3 interposed therebetween, and has generally the same shape and generally the same area as those of the p-electrode 5. The conductor portion 9 and the inner wall of the through hole 8 are electrically coupled with each other. Since the through hole 8 is formed in the m-plane GaN substrate 1, a lateral surface of the c-plane or the a-plane can be formed at the inner wall of the through hole 8.

The impurity concentration of the n-type conductive layer 2 is, for example, not less than $1 \times 10^{17}$ cm$^{-3}$ and not more than $2 \times 10^{18}$ cm$^{-3}$. The thickness of the n-type GaN substrate 1 is about 100 μm. The thickness of the n-type conductive layer 2 is, for example, about 5 μm.

The n-type rear surface electrode 7 of the present embodiment does not necessarily have the structure shown in FIGS. 16(a) and 16(b). The n-type rear surface electrode 7 may be provided in a region extending over the p-electrode 5 when seen in a direction perpendicular to the principal surface of the n-type conductive layer 2. Note that, however, as the area of the region in which the n-type rear surface electrode 7 is provided increases, the heat releasability improves, and the resistance decreases. The present embodiment has the same configuration as that of Embodiment 1 except for the structure of the n-type rear surface electrode 7. The descriptions of the same aspects of the configuration are omitted herein.

In the present embodiment, the same effects as those of Embodiment 1 can be achieved. Furthermore, in the present embodiment, the contact area of the n-type semiconductor layer and the electrode is greater than that of Embodiment 1, so that the contact resistance further decreases. Further, the voltage from the entire rear surface 1b can be applied to the active layer 3, so that the current injection to the active layer 3 can be more uniform, and the amount of the current injection can be increased. As a result, a greater light output can be achieved. Also, concentration of the electric current is decreased, so that the reliability of the electrodes improves.

Furthermore, the n-type front surface electrode 6 may be provided on the principal surface of the n-type conductive layer 2, which enables flip-chip mounting. This configuration enhances transfer of the heat from the chip to the mounting base 12, so that the heat releasability and the reliability can be further improved.

Figure 17:
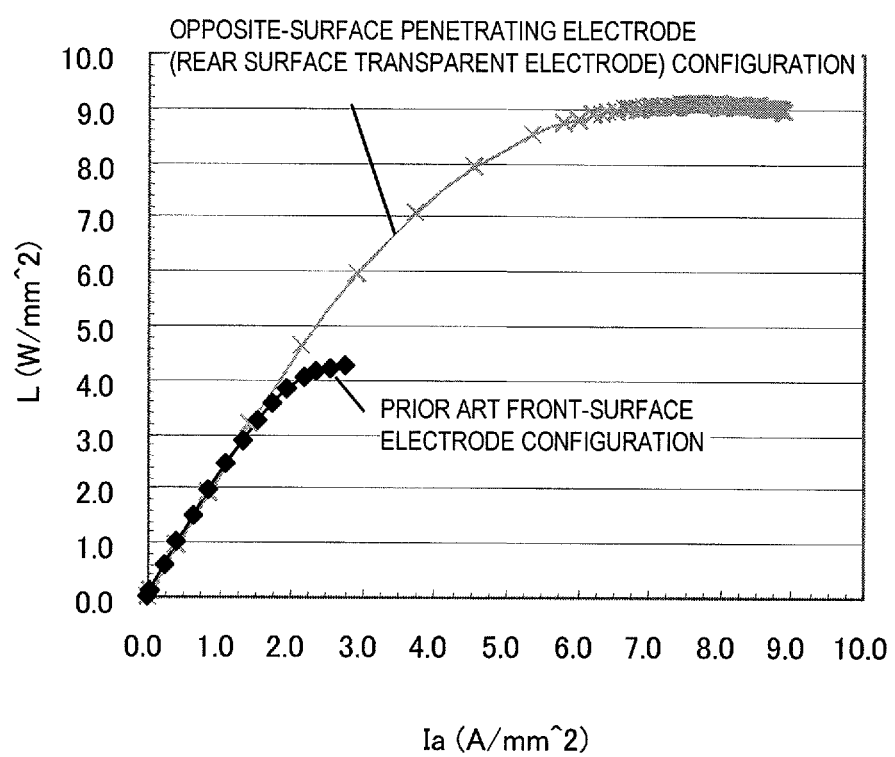
FIG. 17 is a graph showing the simulation results of the electric current dependence of the light output from a GaN-based light-emitting diode.

FIG. 17 is a graph showing the simulation results of the electric current dependence of the light output from a GaN-based light-emitting diode. The simulation result of the prior art shown in FIG. 17 was obtained using a light-emitting diode which had the front-surface electrode configuration shown in FIGS. 5(a) and 5(b). As seen from FIG. 17, in the present embodiment, a greater light output was achieved with the same electric current as compared with the prior art, so that the efficiency was improved. Comparing with the simulation result of Embodiment 1 shown in FIG. 8, when the value of the horizontal axis is large, the value of the light output is greater in the present embodiment. For example, when the value of the horizontal axis is 3 (A/mm$^2$), the value of the light output is close to 6 W/mm$^2$ in the present embodiment, whereas the value of the light output is 5 W/mm$^2$ in Embodiment 1. When compared with Embodiment 1, it is inferred that, in the present embodiment, the area of the n-type rear surface electrode 7 at the rear surface 1b is larger, so that the heat releasability is improved, and the resistance is decreased. Since the voltage from the entire rear surface 1b can be applied to the active layer 3, the current injection to the active layer 3 is uniform, and a greater magnitude of electric current can be allowed to flow.

Embodiment 7

Figure 18:
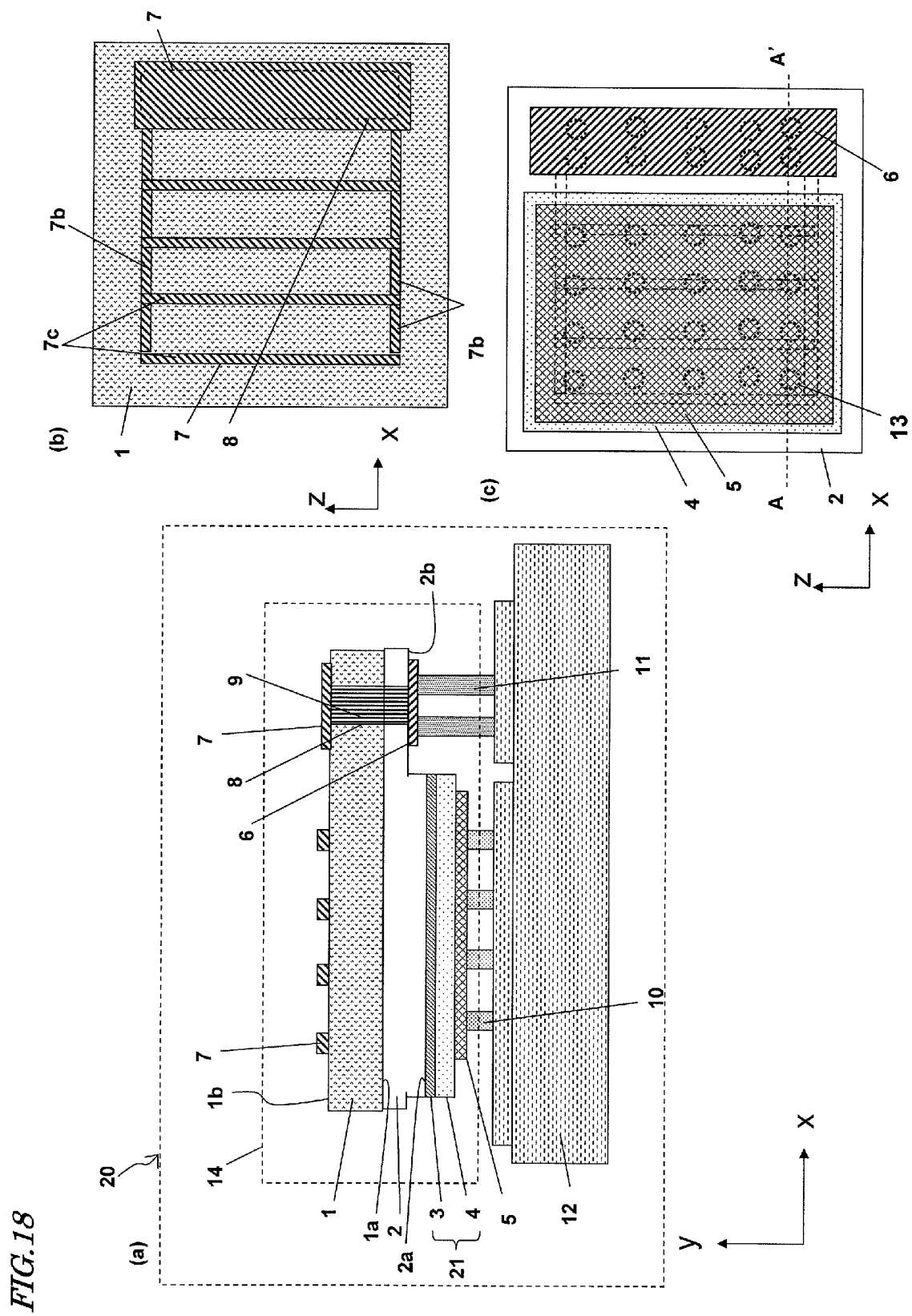
FIG. 18(a) is a cross-sectional view showing Embodiment 7 of the light-emitting diode device according to the present invention.
FIG. 18(b) is a diagram showing a rear surface 1b of an n-type GaN substrate 1 shown in FIG. 18(a).
FIG. 18(c) is a diagram showing a surface of a light-emitting diode element 14 shown in FIG. 18(a) which is on the principal surface side.

FIG. 18(a) is a cross-sectional view showing Embodiment 7 of the light-emitting diode device according to the present invention. FIG. 18(b) is a diagram showing a rear surface 1b of an n-type GaN substrate 1 shown in FIG. 18(a). FIG. 18(c) is a diagram showing a surface of a light-emitting diode element 14 shown in FIG. 18(a) which is on the principal surface side. In FIGS. 18(a) to 18(c), components which are the same as those of FIGS. 6(a) to 6(c) are denoted by the same marks.

As shown in FIGS. 18(a) to 18(c), in the present embodiment, the n-type rear surface electrode 7 is provided on the rear surface 1b of the n-type GaN substrate 1. When seen in a direction perpendicular to the principal surface of the n-type conductive layer 2 (y direction), the n-type rear surface electrode 7 is provided not only in a region extending over the n-type front surface electrode 6 but also in a region extending over the p-electrode 5 with the active layer 3 interposed therebetween. The n-type rear surface electrode 7 includes a main portion 7a covering the n-type through electrode 9, linear x-direction extended portions 7b extending from the main portion 7a in the x direction, and a plurality of linear z-direction extended portions 7c extending in the z direction. The opposite ends of each of the z-direction extended portions 7c are connected to the x-direction extended portions 7b. As such, the main portion 7a, the x-direction extended portions 7b, and the z-direction extended portions 7c are all electrically coupled together. In this way, the n-type rear surface electrode 7 is provided on the rear surface 1b at an approximately uniform density so that the voltage can be uniformly applied to the active layer 3. Light generated in the active layer 3 is extracted at the rear surface of the n-type GaN substrate 1, through the gaps between the x-direction extended portions 7b and the z-direction extended portions 7c.

The n-type rear surface electrode 7 does not necessarily have the configuration shown in FIG. 18(b). The n-type rear surface electrode 7 may have a different shape, such as a lattice shape, so long as the n-type rear surface electrode 7 is provided on the rear surface 1b at an approximately uniform density and that the gaps are provided through which light can be extracted at the rear surface 1b. The present embodiment has the same configuration as that of Embodiment 1 except for the structure of the n-type rear surface electrode 7. The descriptions of the same aspects of the configuration are omitted herein.

The impurity concentration of the n-type substrate 1 and the n-type conductive layer 2 is, for example, not less than $1\times10^{17}$ cm$^{-3}$ and not more than $2\times10^{18}$ cm$^{-3}$. The thickness of the n-type GaN substrate 1 is about 100 μm. The thickness of the n-type conductive layer 2 is, for example, about 5 μm.

In the present embodiment, the same effects as those of Embodiment 1 can be achieved. Furthermore, in the present embodiment, the contact area of the n-type semiconductor layer and the electrode is greater than that of Embodiment 1, so that the contact resistance further decreases. Further, the voltage from the entire rear surface 1b can be applied to the active layer 3, so that the current injection to the active layer 3 can be more uniform, and the amount of the current injection can be increased. As a result, a greater light output can be achieved. Also, concentration of the electric current is decreased, so that the reliability of the electrodes improves.

In Embodiment 6, the n-type rear surface electrode 7 is provided at a position so as to oppose the p-electrode 5 and has generally the same area as the p-electrode 5. In contrast, in the present embodiment, the n-type rear surface electrode 7 is not provided over the entire rear surface 1b. Therefore, in the present embodiment, the voltage applied to the active layer 3 is less uniform as compared with Embodiment 6. However, in the present embodiment, the usual disadvantages of transparent electrode materials, such as an increase in contact resistance, poor adhesion, etc., can be avoided. The present embodiment has an advantage that an inexpensive electrode material can be used.

Furthermore, the n-type front surface electrode 6 may be provided on the principal surface of the n-type conductive layer 2, which enables flip-chip mounting. This configuration enhances transfer of the heat from the chip to the mounting base 12, so that the heat releasability and the reliability can be further improved.

Figure 19:
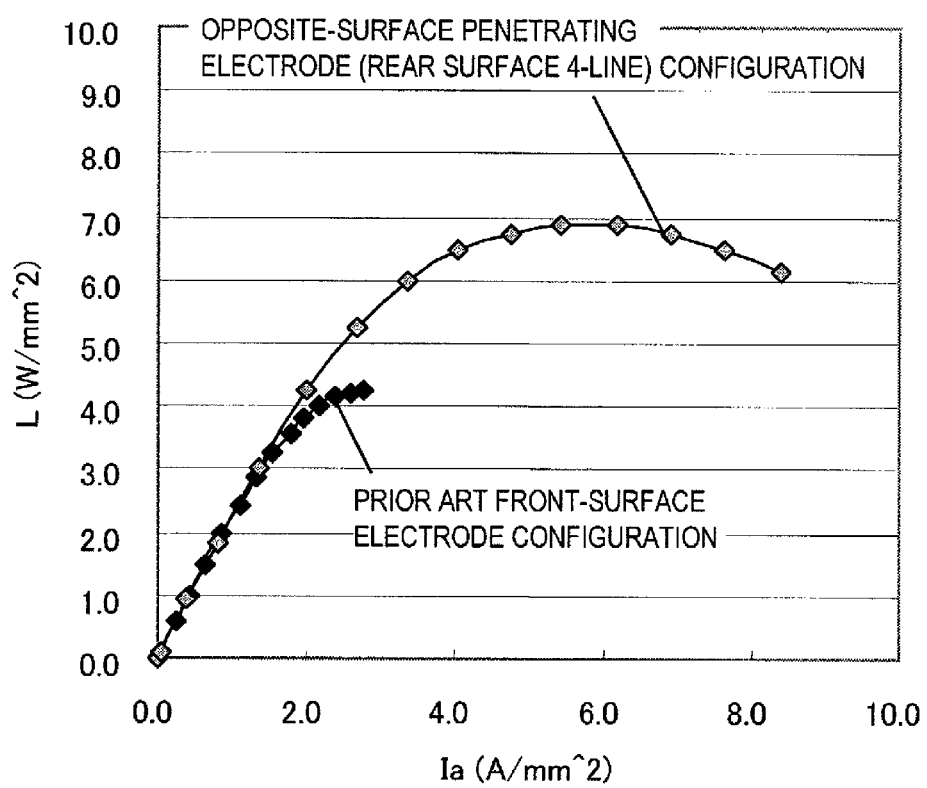
FIG. 19 is a graph showing the simulation results of the electric current dependence of the light output from a GaN-based light-emitting diode.

FIG. 19 is a graph showing the simulation results of the electric current dependence of the light output from a GaN-based light-emitting diode. The simulation result of the prior art shown in FIG. 19 was obtained using a light-emitting diode which had the front-surface electrode configuration shown in FIGS. 5(a) and 5(b). As seen from FIG. 19, in the present embodiment, a greater light output was achieved with the same electric current as compared with the prior art, so that the efficiency was improved. Comparing with the simulation result of Embodiment 1 shown in FIG. 8, when the value of the horizontal axis is large, the value of the light output is greater in the present embodiment. For example, when the value of the horizontal axis is 3 (A/mm²), the value of the light output is about 5.5 W/mm² in the present embodiment, whereas the value of the light output is 5 W/mm² in Embodiment 1. When compared with Embodiment 1, it is inferred that, in the present embodiment, the area of the n-type rear surface electrode 7 at the rear surface 1b is larger, so that the heat releasability is improved, and the resistance is decreased. Since the voltage from the rear surface 1b can be uniformly applied to the active layer 3, the current injection to the active layer 3 is uniform, and a still greater magnitude of electric current can be allowed to flow.

Embodiment 8

FIG. 20(a) is a cross-sectional view showing Embodiment 8 of the light-emitting diode device according to the present invention. FIG. 20(b) is a diagram showing a rear surface 2c of an n-type conductive layer 2 shown in FIG. 20(a). FIG. 20(c) is a diagram showing a surface of a light-emitting diode element 14 shown in FIG. 20(a) which is on the principal surface side. In FIGS. 20(a) to 20(c), components which are the same as those of FIGS. 6(a) to 6(c) are denoted by the same marks.

As shown in FIGS. 20(a) to 20(c), the light-emitting diode element 14 of the present embodiment does not have the n-type GaN substrate 1. The through hole 8 and the conductor portion 9 are provided in the n-type conductive layer 2. On the rear surface 2c of the n-type conductive layer 2, the n-type rear surface electrode 7 which is made of a transparent material, such as ITO (Indium Tin Oxide), is provided. The n-type rear surface electrode 7 is provided at a position so as to oppose the p-electrode 5, with the active layer 3 interposed therebetween, and has generally the same shape and generally the same area as those of the p-electrode 5. The present embodiment has the same configuration as that of Embodiment 1 except that the substrate is omitted and except for the structure of the n-type rear surface electrode 7. The descriptions of the same aspects of the configuration are omitted herein.

The impurity concentration of the n-type conductive layer 2 is, for example, not less than $1\times10^{17}$ cm$^3$ and not more than $2\times10^{18}$ cm$^{-3}$. The thickness of the n-type conductive layer 2 is, for example, about 5 μm.

The n-type conductive layer 2 may be realized by, for example, crystal growth on a substrate, such as a sapphire substrate. The substrate is removed after formation of the light-emitting diode element 14, whereby a thin chip can be obtained. Removal of the substrate may be realized by peeling, etching, or CMP. In the case of etching or the like, the substrate may not be entirely removed, so that only part of the substrate is left unremoved.

In the present embodiment, the same effects as those of Embodiment 6 can be achieved. Furthermore, in the present embodiment, the n-type semiconductor layer is thin, so that the light extraction efficiency improves, and the device size can be decreased. The prior art light-emitting diode of the front-surface electrode type has a problem that decreasing the thickness of the n-type semiconductor layer causes an increase in resistance of the n-type semiconductor layer in terms of the horizontal direction. In the present embodiment, the n-type rear surface electrode 7 is also provided on the rear surface 2c, and therefore, carriers can vertically transfer. Thus, the problem of increase in resistance of the n-type semiconductor layer can be avoided. Also, concentration of the electric current is decreased, so that the reliability of the electrodes improves.

Figure 21:
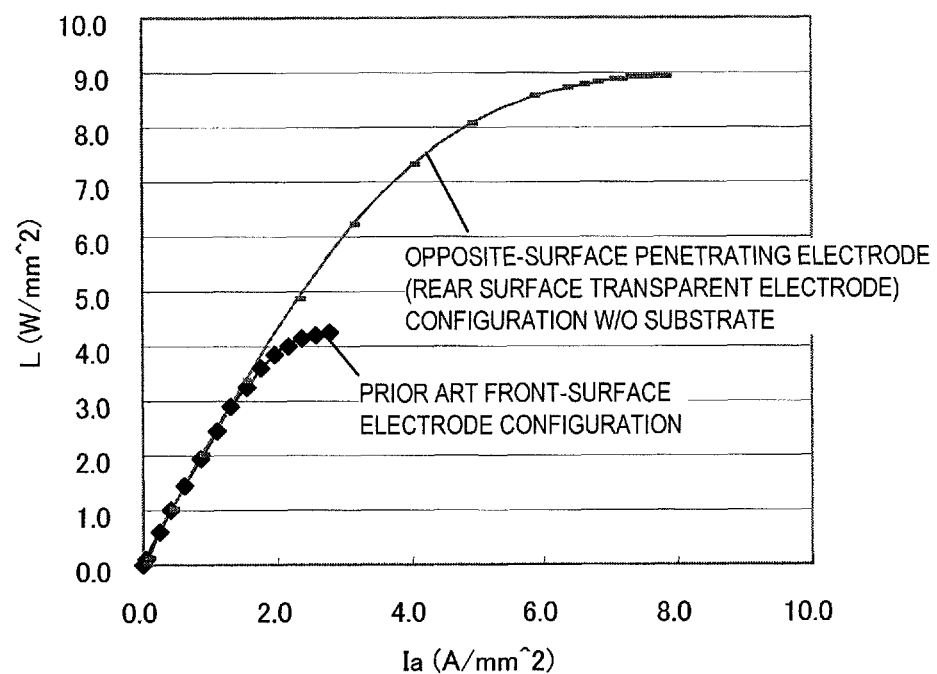
FIG. 21 is a graph showing the simulation results of the electric current dependence of the light output from a GaN-based light-emitting diode.

FIG. 21 is a graph showing the simulation results of the electric current dependence of the light output from a GaN-based light-emitting diode. The simulation result of the prior art shown in FIG. 21 was obtained using a light-emitting diode which had the front-surface electrode configuration shown in FIGS. 5(a) and 5(b). As seen from FIG. 21, in the present embodiment, a greater light output was achieved with the same electric current as compared with the prior art, so that the efficiency was improved. In the present embodiment, the area of the n-type rear surface electrode 7 on the rear surface 2c is larger so that, it is expected that, the heat releasability improves and the resistance decreases. Further, the voltage from the entire rear surface 2c can be applied to the active layer 3, so that the current injection to the active layer 3 is uniform, and a still greater magnitude of electric current can be allowed to flow. As a result, a greater light output can be achieved. Furthermore, the n-type front surface electrode 6 may be provided on the principal surface of the n-type conductive layer 2, which enables flip-chip mounting. This configuration enhances transfer of the heat from the chip to the mounting base 12, so that the heat releasability and the reliability can be further improved.

Figure 20:
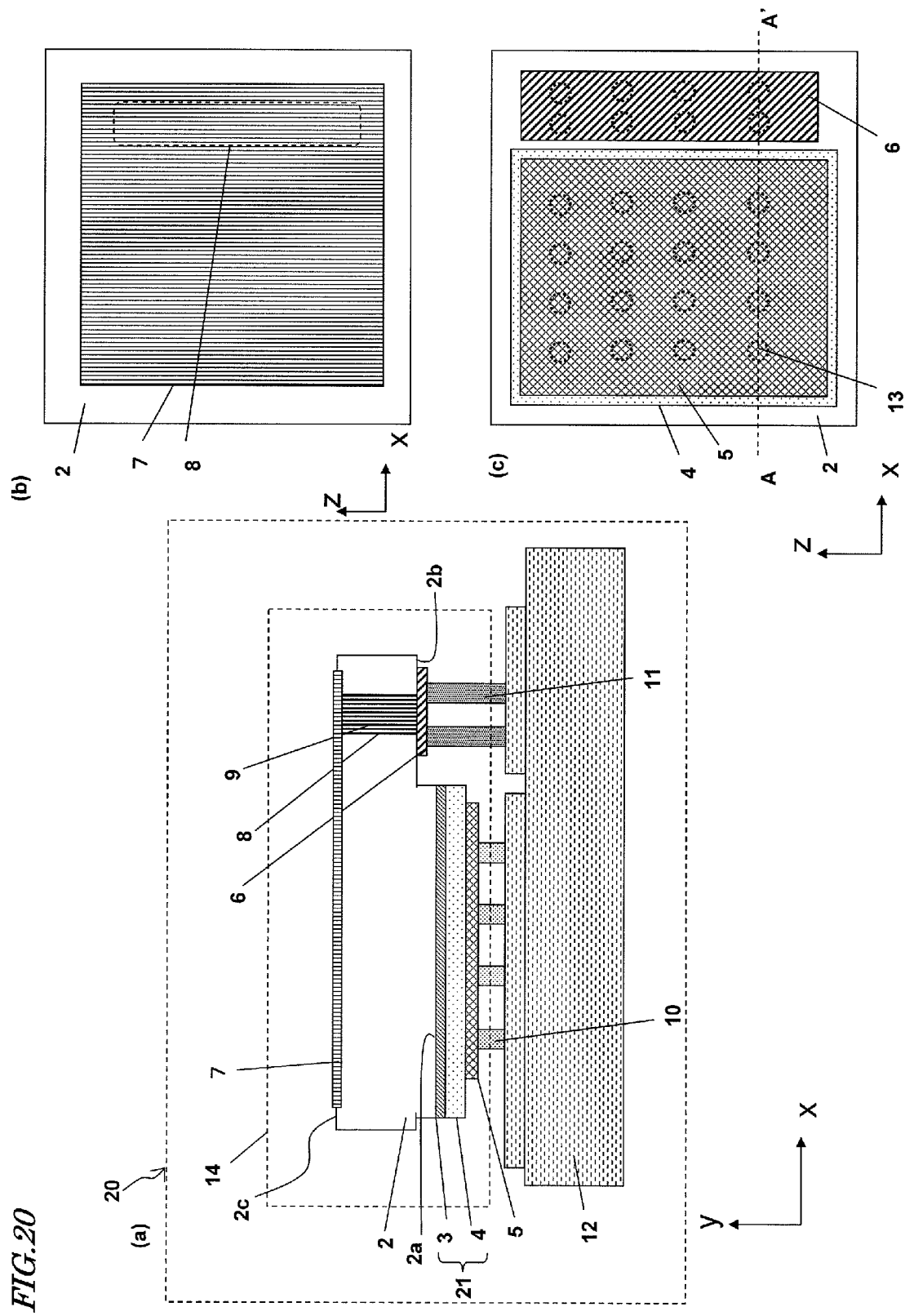
FIG. 20(a) is a cross-sectional view showing Embodiment 8 of the light-emitting diode device according to the present invention.
FIG. 20(b) is a diagram showing a rear surface 2c of an n-type conductive layer 2 shown in FIG. 20(a).
FIG. 20(c) is a diagram showing a surface of a light-emitting diode element 14 shown in FIG. 20(a) which is on the principal surface side.

Although FIG. 20 shows a configuration wherein the n-type rear surface electrode 7 is provided over the entire rear surface 2c, the n-type rear surface electrode 7 of the present embodiment may have a linear-shape structure provided on the rear surface 2c as in Embodiment 7.

INDUSTRIAL APPLICABILITY

A semiconductor light-emitting element of the present disclosure is suitably used as a light source for display devices, lighting devices, and LCD backlight devices.

REFERENCE SIGNS LIST 1 n-type substrate
1a principal surface
1b rear surface
n-type conductive layer
2a first region
2b second region
2c rear surface
3 active layer
4 p-type conductive layer
5 p-type electrode
6 n-type front surface electrode
7 n-type rear surface electrode
7a main portion
7b x-direction extended portion
7c z-direction extended portion
8 through hole
8' recessed portion
8a +c-plane
8b −c-plane
8c, 8d a-plane
9 conductor portion
9' conductor portion
9a conductor portion
10 bump
11 bump
12 mounting base
13 bump position
14 light-emitting diode chip
15 bonding pad
16 wire
20 light-emitting diode device
21 semiconductor multilayer structure

The invention claimed is:

1. A light-emitting diode element, comprising:
a first semiconductor layer of a first conductivity type having a principal surface and a rear surface, the first semiconductor layer being made of a gallium nitride-based compound, the principal surface being an m-plane;
a semiconductor multilayer structure provided on a first region of the principal surface of the first semiconductor layer, the semiconductor multilayer structure including a second semiconductor layer of a second conductivity type and an active layer interposed between the first semiconductor layer and the second semiconductor layer;
a first electrode provided on the second semiconductor layer;
a conductor portion provided on a second region of the principal surface of the first semiconductor layer, the conductor portion being in contact with an inner wall of a through hole penetrating through the first semiconductor layer; and
a second electrode provided on the second region of the principal surface of the first semiconductor layer, the second electrode being in contact with the conductor portion,
wherein a lateral surface of the inner wall of the through hole includes a c-plane or an a-plane.

2. The light-emitting diode element of claim 1, further comprising a third electrode provided on the rear surface of the first semiconductor layer,
wherein the conductor portion and the third electrode are in contact with each other.

3. The light-emitting diode element of claim 1, wherein the first semiconductor layer includes a semiconductor substrate of the first conductivity type.

4. The light-emitting diode element of claim 1, wherein
part of a lateral surface of the inner wall of the through hole is a +c-plane, and another part of the lateral surface of the inner wall of the through hole is a −c-plane; and
the +c-plane at the lateral surface of the inner wall is provided at a position which is closer to the active layer than the −c-plane at the lateral surface of the inner wall.

5. The light-emitting diode element of claim 1, wherein the through hole is provided in a central portion of the principal surface of the first semiconductor layer.

6. The light-emitting diode element of claim 1, wherein
a lateral surface of the inner wall of the through hole includes two opposite a-planes and a +c-plane and a −c-plane which are opposite to each other; and
when viewed in a direction perpendicular to the principal surface of the first semiconductor layer, the active layer has a side corresponding to a side defined by one of the two a-planes, a side corresponding to a side defined by the other one of the two a-planes, and a side corresponding to a side defined by the +c-plane, but does not have a side corresponding to a side defined by the −c-plane.

7. The light-emitting diode element of claim 6, wherein when viewed in a direction perpendicular to the principal surface of the first semiconductor layer, the through hole has a square or rectangular shape, and the active layer has a square-shaped or rectangular-shaped recess.

8. The light-emitting diode element of claim 2, wherein the second electrode, the third electrode, and the conductor portion are integrally made of a same metal material.

9. The light-emitting diode element of claim 2, wherein when viewed in a direction perpendicular to the principal surface of the first semiconductor layer, the third electrode is provided in a region extending over the first electrode.

10. The light-emitting diode element of claim 2, wherein when viewed in a direction perpendicular to the principal surface of the first semiconductor layer, portions of the third electrode are provided in regions extending over the first electrode with a space therebetween.

11. A light-emitting diode device, comprising:
the light-emitting diode element as set forth in claim 1; and
a mounting base,
wherein the light-emitting diode element is provided on the mounting base such that a side of the light-emitting diode element on which the first electrode and the second electrode are provided is opposite to the mounting base.

* * * * *